US008775112B2

(12) United States Patent
Van Dyke et al.

(10) Patent No.: US 8,775,112 B2
(45) Date of Patent: Jul. 8, 2014

(54) SYSTEM AND METHOD FOR INCREASING DIE YIELD

(75) Inventors: James M. Van Dyke, Austin, TX (US); John S. Montrym, Cupertino, CA (US); Michael B. Nagy, Agoura Hills, CA (US); Sean J. Treichler, Mountain View, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 10/740,723

(22) Filed: Dec. 18, 2003

(65) Prior Publication Data

US 2005/0251358 A1 Nov. 10, 2005

Related U.S. Application Data

(60) Provisional application No. 60/503,710, filed on Sep. 15, 2003.

(51) Int. Cl.
*G01R 27/28* (2006.01)

(52) U.S. Cl.
USPC ............... 702/117; 702/81; 438/17; 438/128

(58) Field of Classification Search
USPC ..................... 702/81–84, 108, 117–120, 179, 702/182–186; 438/4, 5, 7, 10, 16, 17, 24, 438/128, 129, 130, 131; 257/48; 324/500, 324/534, 755, 763; 700/108–110; 716/4
See application file for complete search history.

(56) References Cited

U.S. PATENT DOCUMENTS

| | | | |
|---|---|---|---|
| 3,940,740 A * | 2/1976 | Coontz | ........................ 438/130 |
| 4,208,810 A | 6/1980 | Rohner et al. | |
| 4,412,281 A | 10/1983 | Works | |
| 4,449,730 A | 5/1984 | Oberleitner et al. | |
| 4,541,075 A | 9/1985 | Dill et al. | |
| 4,773,044 A | 9/1988 | Sfarti et al. | |
| 4,885,703 A | 12/1989 | Deering | |
| 4,918,626 A | 4/1990 | Watkins et al. | |

(Continued)

FOREIGN PATENT DOCUMENTS

| | | |
|---|---|---|
| CN | 101093578 | 12/2007 |
| JP | 61020348 | 1/1986 |

(Continued)

OTHER PUBLICATIONS

Welch, D. "Building Self-Reconfiguring Distributed Systems Using Compensating Reconfiguration", Proceedings Fourth International Journal Conference on Configurable Distributed Systems, May 4-6, 1998, pp. 18-25.

(Continued)

*Primary Examiner* — Manuel L Barbee

(57) ABSTRACT

The present invention systems and methods facilitate increased die yields by flexibly changing the operational characteristics of functional components in an integrated circuit die. The present invention system and method enable integrated circuit chips with defective functional components to be salvaged. Defective functional components in the die are disabled in a manner that maintains the basic functionality of the chip. A chip is tested and a functional component configuration process is performed on the chip based upon results of the testing. If an indication of a defective functional component is received, the functional component is disabled. Workflow is diverted from disabled functional components to enabled functional components.

16 Claims, 14 Drawing Sheets

(56) References Cited

U.S. PATENT DOCUMENTS

| | | | |
|---|---|---|---|
| 4,949,280 A | 8/1990 | Littlefield | |
| 4,951,220 A | 8/1990 | Ramacher et al. | 716/4 |
| 4,985,988 A * | 1/1991 | Littlebury | 438/15 |
| 5,036,473 A | 7/1991 | Butts et al. | 703/23 |
| 5,077,660 A | 12/1991 | Haines et al. | |
| 5,081,594 A | 1/1992 | Horsley | |
| 5,107,455 A | 4/1992 | Haines et al. | |
| 5,125,011 A | 6/1992 | Fung | |
| 5,276,893 A | 1/1994 | Savaria | |
| 5,287,438 A | 2/1994 | Kelleher | |
| 5,313,287 A | 5/1994 | Barton | |
| 5,379,405 A | 1/1995 | Ostrowski | |
| 5,392,437 A | 2/1995 | Matter et al. | 713/324 |
| 5,400,777 A | 3/1995 | Olsson et al. | |
| 5,408,606 A | 4/1995 | Eckart | |
| 5,432,898 A | 7/1995 | Curb et al. | |
| 5,446,836 A | 8/1995 | Lentz et al. | |
| 5,448,496 A | 9/1995 | Butts et al. | 716/16 |
| 5,452,104 A | 9/1995 | Lee | |
| 5,452,412 A | 9/1995 | Johnson, Jr. et al. | |
| 5,455,536 A | 10/1995 | Kono et al. | |
| 5,483,258 A | 1/1996 | Cornett et al. | |
| 5,498,975 A | 3/1996 | Cliff et al. | |
| 5,513,144 A | 4/1996 | O'Toole | |
| 5,513,354 A | 4/1996 | Dwork et al. | 718/106 |
| 5,517,666 A | 5/1996 | Ohtani et al. | |
| 5,530,457 A | 6/1996 | Helgeson | |
| 5,543,935 A | 8/1996 | Harrington | |
| 5,570,463 A | 10/1996 | Dao | |
| 5,574,847 A | 11/1996 | Eckart et al. | |
| 5,578,976 A | 11/1996 | Yao | 333/262 |
| 5,594,854 A | 1/1997 | Baldwin et al. | |
| 5,623,692 A | 4/1997 | Priem et al. | |
| 5,630,171 A | 5/1997 | Chejlava, Jr. et al. | |
| 5,633,297 A | 5/1997 | Valko et al. | |
| 5,634,107 A | 5/1997 | Yumoto et al. | |
| 5,638,946 A | 6/1997 | Zavracky | 200/181 |
| 5,664,162 A | 9/1997 | Dye | |
| 5,671,376 A | 9/1997 | Bucher et al. | |
| 5,694,143 A | 12/1997 | Fielder et al. | |
| 5,705,938 A | 1/1998 | Kean | |
| 5,766,979 A * | 6/1998 | Budnaitis | 438/15 |
| 5,768,178 A | 6/1998 | McLaury | |
| 5,778,348 A | 7/1998 | Manduley et al. | |
| 5,805,833 A | 9/1998 | Verdun | |
| 5,809,230 A | 9/1998 | Pereira | |
| 5,815,162 A | 9/1998 | Levine | |
| 5,821,949 A | 10/1998 | Deering | |
| 5,854,631 A | 12/1998 | Akeley et al. | |
| 5,854,637 A | 12/1998 | Sturges | |
| 5,872,902 A | 2/1999 | Kuchkuda et al. | |
| 5,884,053 A | 3/1999 | Clouser et al. | |
| 5,896,391 A | 4/1999 | Solheim et al. | |
| 5,909,595 A | 6/1999 | Rosenthal et al. | |
| 5,913,218 A | 6/1999 | Carney et al. | 707/200 |
| 5,937,173 A | 8/1999 | Olarig et al. | |
| 5,956,252 A | 9/1999 | Lau et al. | 700/120 |
| 5,956,505 A | 9/1999 | Manduley | |
| 5,968,175 A | 10/1999 | Morishita et al. | |
| 5,977,987 A | 11/1999 | Duluk, Jr. | |
| 5,996,996 A * | 12/1999 | Brunelle | 209/573 |
| 5,999,990 A | 12/1999 | Sharrit et al. | 710/8 |
| 6,003,100 A | 12/1999 | Lee | |
| 6,028,608 A | 2/2000 | Jenkins | |
| 6,034,699 A | 3/2000 | Wong et al. | |
| 6,038,348 A | 3/2000 | Carley | |
| 6,049,870 A | 4/2000 | Greaves | 713/1 |
| 6,065,131 A | 5/2000 | Andrews et al. | 713/600 |
| 6,067,262 A | 5/2000 | Irrinki | 365/201 |
| 6,067,633 A | 5/2000 | Robbins et al. | |
| 6,069,540 A | 5/2000 | Berenz et al. | 333/101 |
| 6,072,500 A | 6/2000 | Foran et al. | |
| 6,072,686 A | 6/2000 | Yarbrough | 361/234 |
| 6,085,269 A | 7/2000 | Chan et al. | |
| 6,094,116 A | 7/2000 | Tai et al. | 335/78 |
| 6,098,118 A | 8/2000 | Ellenby et al. | |
| 6,104,407 A | 8/2000 | Aleksic et al. | |
| 6,104,417 A | 8/2000 | Nielsen et al. | |
| 6,115,049 A | 9/2000 | Winner et al. | |
| 6,118,394 A | 9/2000 | Onaya | |
| 6,128,000 A | 10/2000 | Jouppi et al. | |
| 6,129,070 A | 10/2000 | Jingu et al. | |
| 6,137,918 A | 10/2000 | Harrington et al. | |
| 6,160,557 A | 12/2000 | Narayanaswami | |
| 6,160,559 A | 12/2000 | Omtzigt | |
| 6,188,394 B1 | 2/2001 | Morein et al. | |
| 6,201,545 B1 | 3/2001 | Wong et al. | |
| 6,204,859 B1 | 3/2001 | Jouppi et al. | |
| 6,219,070 B1 | 4/2001 | Baker et al. | |
| 6,219,628 B1 | 4/2001 | Kodosky | 703/2 |
| 6,249,288 B1 | 6/2001 | Campbell | |
| 6,249,853 B1 | 6/2001 | Porterfield | |
| 6,255,849 B1 | 7/2001 | Mohan | 326/41 |
| 6,256,758 B1 | 7/2001 | Abramovici et al. | |
| 6,259,460 B1 | 7/2001 | Gossett et al. | |
| 6,307,169 B1 | 10/2001 | Sun et al. | |
| 6,317,804 B1 | 11/2001 | Levy et al. | |
| 6,323,699 B1 | 11/2001 | Quiet | |
| 6,323,874 B1 | 11/2001 | Gossett | |
| 6,348,811 B1 | 2/2002 | Haycock et al. | |
| 6,359,623 B1 | 3/2002 | Larson | |
| 6,362,819 B1 | 3/2002 | Dalal et al. | |
| 6,363,285 B1 * | 3/2002 | Wey | 607/100 |
| 6,363,295 B1 * | 3/2002 | Akram et al. | 700/121 |
| 6,366,289 B1 | 4/2002 | Johns | |
| 6,370,603 B1 | 4/2002 | Silverman et al. | |
| 6,377,898 B1 | 4/2002 | Steffan et al. | 702/82 |
| 6,388,590 B1 | 5/2002 | Ng | |
| 6,389,585 B1 | 5/2002 | Masleid et al. | |
| 6,392,431 B1 * | 5/2002 | Jones | 324/760 |
| 6,429,288 B1 | 8/2002 | Esswein et al. | |
| 6,429,747 B2 | 8/2002 | Franck et al. | |
| 6,429,877 B1 | 8/2002 | Stroyan | |
| 6,433,657 B1 | 8/2002 | Chen | 333/262 |
| 6,437,780 B1 | 8/2002 | Baltaretu et al. | |
| 6,452,595 B1 | 9/2002 | Montrym et al. | |
| 6,469,707 B1 | 10/2002 | Voorhies | |
| 6,480,205 B1 | 11/2002 | Greene et al. | |
| 6,486,425 B2 | 11/2002 | Seki | 200/181 |
| 6,501,564 B1 | 12/2002 | Schramm et al. | |
| 6,504,542 B1 | 1/2003 | Voorhies et al. | |
| 6,504,841 B1 | 1/2003 | Larson et al. | 370/386 |
| 6,522,329 B1 | 2/2003 | Ihara et al. | |
| 6,525,737 B1 | 2/2003 | Duluk, Jr. et al. | |
| 6,529,207 B1 | 3/2003 | Landau et al. | |
| 6,530,045 B1 * | 3/2003 | Cooper et al. | 714/719 |
| 6,530,049 B1 | 3/2003 | Abramovici et al. | |
| 6,535,986 B1 | 3/2003 | Rosno et al. | 713/400 |
| 6,550,030 B1 | 4/2003 | Abramovici et al. | |
| 6,598,194 B1 | 7/2003 | Madge et al. | 714/745 |
| 6,606,093 B1 | 8/2003 | Gossett et al. | |
| 6,611,272 B1 | 8/2003 | Hussain et al. | |
| 6,614,444 B1 | 9/2003 | Duluk, Jr. et al. | |
| 6,614,448 B1 | 9/2003 | Garlick et al. | |
| 6,624,823 B2 | 9/2003 | Deering | |
| 6,629,181 B1 | 9/2003 | Alappat et al. | |
| 6,633,197 B1 | 10/2003 | Sutardja | |
| 6,633,297 B2 | 10/2003 | McCormack et al. | |
| 6,636,212 B1 | 10/2003 | Zhu | |
| 6,646,639 B1 | 11/2003 | Greene et al. | |
| 6,662,133 B2 * | 12/2003 | Engel et al. | 702/117 |
| 6,671,000 B1 | 12/2003 | Cloutier | |
| 6,693,637 B2 | 2/2004 | Koneru et al. | |
| 6,693,639 B2 | 2/2004 | Duluk, Jr. et al. | |
| 6,697,063 B1 | 2/2004 | Zhu | |
| 6,700,581 B2 | 3/2004 | Baldwin et al. | 345/519 |
| 6,701,466 B1 | 3/2004 | Fiedler | |
| 6,717,474 B2 | 4/2004 | Chen et al. | |
| 6,717,576 B1 | 4/2004 | Duluk, Jr. et al. | |
| 6,717,578 B1 | 4/2004 | Deering | |
| 6,718,496 B1 | 4/2004 | Fukuhisa et al. | |
| 6,734,770 B2 | 5/2004 | Aigner et al. | 335/78 |
| 6,734,861 B1 | 5/2004 | Van Dyke et al. | |
| 6,738,856 B1 | 5/2004 | Milley et al. | |

(56) References Cited

U.S. PATENT DOCUMENTS

| | | |
|---|---|---|
| 6,741,247 B1 | 5/2004 | Fenney |
| 6,741,258 B1 | 5/2004 | Peck, Jr. et al. |
| 6,742,000 B1 | 5/2004 | Fantasia et al. |
| 6,747,057 B2 | 6/2004 | Ruzafa et al. |
| 6,747,483 B2 | 6/2004 | To et al. |
| 6,765,575 B1 | 7/2004 | Voorhies et al. |
| 6,778,177 B1 | 8/2004 | Furtner |
| 6,782,587 B2 | 8/2004 | Reilly |
| 6,785,841 B2 | 8/2004 | Akrout et al. |
| 6,788,101 B1 | 9/2004 | Rahman |
| 6,788,301 B2 | 9/2004 | Thrasher |
| 6,794,101 B2 | 9/2004 | Liu et al. ............. 430/48 |
| 6,798,410 B1 | 9/2004 | Redshaw et al. |
| 6,803,782 B2 | 10/2004 | Koob et al. |
| 6,803,916 B2 | 10/2004 | Ramani et al. |
| 6,806,788 B1 | 10/2004 | Marumoto ............. 333/101 |
| 6,819,332 B2 | 11/2004 | Baldwin |
| 6,823,283 B2 | 11/2004 | Steger et al. ............ 702/127 |
| 6,825,847 B1 | 11/2004 | Molnar et al. |
| 6,833,835 B1 | 12/2004 | van Vugt |
| 6,849,924 B2 | 2/2005 | Allison et al. ............. 257/635 |
| 6,850,133 B2 | 2/2005 | Ma ...................... 335/78 |
| 6,861,865 B1 | 3/2005 | Carlson |
| 6,862,027 B2 | 3/2005 | Andrews et al. |
| 6,879,207 B1* | 4/2005 | Nickolls ............. 327/526 |
| 6,906,716 B2 | 6/2005 | Moreton et al. |
| 6,938,176 B1 | 8/2005 | Alben et al. |
| 6,940,514 B1 | 9/2005 | Wasserman et al. |
| 6,947,057 B2 | 9/2005 | Nelson et al. |
| 6,956,579 B1 | 10/2005 | Diard et al. |
| 6,961,057 B1 | 11/2005 | Van Dyke et al. |
| 6,961,065 B2 | 11/2005 | Sasaki |
| 6,966,020 B1 | 11/2005 | Abramovici et al. |
| 6,973,608 B1 | 12/2005 | Abramovici et al. |
| 6,978,317 B2 | 12/2005 | Anantha et al. |
| 6,982,718 B2 | 1/2006 | Kilgard et al. |
| 7,002,591 B1 | 2/2006 | Leather et al. |
| 7,009,607 B2 | 3/2006 | Lindholm et al. |
| 7,009,615 B1 | 3/2006 | Kilgard et al. |
| 7,020,598 B1 | 3/2006 | Jacobson ............ 703/14 |
| 7,023,437 B1 | 4/2006 | Voorhies et al. |
| 7,043,622 B2 | 5/2006 | Henry et al. |
| 7,058,738 B2 | 6/2006 | Stufflebeam, Jr. |
| 7,061,495 B1 | 6/2006 | Leather |
| 7,064,771 B1 | 6/2006 | Jouppi et al. |
| 7,069,369 B2 | 6/2006 | Chou et al. |
| 7,069,458 B1 | 6/2006 | Sardi et al. |
| 7,069,558 B1 | 6/2006 | Stone et al. |
| 7,075,542 B1 | 7/2006 | Leather |
| 7,075,797 B1 | 7/2006 | Leonard et al. |
| 7,081,902 B1 | 7/2006 | Crow et al. |
| 7,085,824 B2 | 8/2006 | Forth et al. |
| 7,119,809 B1 | 10/2006 | McCabe |
| 7,124,318 B2 | 10/2006 | Luick |
| 7,126,600 B1 | 10/2006 | Fowler et al. |
| 7,136,953 B1 | 11/2006 | Bisson et al. |
| 7,154,066 B2 | 12/2006 | Talwar et al. |
| 7,158,148 B2 | 1/2007 | Toji et al. |
| 7,170,315 B2 | 1/2007 | Bakker et al. |
| 7,170,515 B1 | 1/2007 | Zhu |
| 7,174,407 B2 | 2/2007 | Hou et al. |
| 7,174,411 B1 | 2/2007 | Ngai |
| 7,184,040 B1 | 2/2007 | Tzvetkov |
| 7,185,135 B1 | 2/2007 | Briggs et al. |
| 7,185,225 B2 | 2/2007 | Sutardja et al. |
| 7,187,383 B2 | 3/2007 | Kent |
| 7,224,364 B1 | 5/2007 | Yue et al. |
| 7,246,274 B2 | 7/2007 | Kizer et al. |
| 7,260,007 B2 | 8/2007 | Jain et al. |
| RE39,898 E | 10/2007 | Nally et al. |
| 7,293,127 B2 | 11/2007 | Caruk |
| 7,305,571 B2 | 12/2007 | Cranford, Jr. et al. |
| 7,307,628 B1 | 12/2007 | Goodman et al. |
| 7,307,638 B2 | 12/2007 | Leather et al. |
| 7,324,458 B2 | 1/2008 | Schoenborn et al. |
| 7,340,541 B2 | 3/2008 | Castro et al. |
| 7,362,325 B2 | 4/2008 | Anderson |
| 7,373,547 B2 | 5/2008 | Sutardja et al. |
| 7,382,368 B1 | 6/2008 | Molnar et al. |
| 7,398,336 B2 | 7/2008 | Feng et al. |
| 7,414,636 B2 | 8/2008 | Kokojima et al. |
| 7,415,551 B2 | 8/2008 | Pescatore |
| 7,424,564 B2 | 9/2008 | Mehta et al. |
| 7,437,021 B2 | 10/2008 | Satoh |
| 7,453,466 B2 | 11/2008 | Hux et al. |
| 7,480,808 B2 | 1/2009 | Caruk et al. |
| 7,483,029 B2 | 1/2009 | Crow et al. |
| 7,525,986 B2 | 4/2009 | Lee et al. |
| 7,548,996 B2 | 6/2009 | Baker et al. |
| 7,551,174 B2 | 6/2009 | Iourcha et al. |
| 7,594,061 B2 | 9/2009 | Shen et al. |
| 7,633,506 B1 | 12/2009 | Leather et al. |
| 7,634,637 B1 | 12/2009 | Lindholm et al. |
| 7,663,633 B1 | 2/2010 | Diamond et al. |
| 7,782,325 B2 | 8/2010 | Gonzalez et al. |
| 7,791,617 B2 | 9/2010 | Crow et al. |
| 7,793,029 B1 | 9/2010 | Parson et al. |
| 7,965,902 B1 | 6/2011 | Zelinka et al. |
| 8,063,903 B2 | 11/2011 | Vignon et al. |
| 8,132,015 B1 | 3/2012 | Wyatt |
| 8,144,166 B2 | 3/2012 | Lyapunov et al. |
| 8,237,738 B1 | 8/2012 | Crow |
| 8,412,872 B1 | 4/2013 | Wagner et al. |
| 8,417,838 B2 | 4/2013 | Tamasi et al. |
| 8,482,567 B1 | 7/2013 | Moreton et al. |
| 8,532,098 B2 | 9/2013 | Reed et al. |
| 2001/0005209 A1 | 6/2001 | Lindholm et al. |
| 2002/0005729 A1 | 1/2002 | Leedy ............. 324/760 |
| 2002/0026623 A1 | 2/2002 | Morooka ............. 716/8 |
| 2002/0031025 A1* | 3/2002 | Shimano et al. ............. 365/201 |
| 2002/0050979 A1 | 5/2002 | Oberoi et al. |
| 2002/0059392 A1 | 5/2002 | Ellis, III |
| 2002/0087833 A1 | 7/2002 | Burns et al. |
| 2002/0091979 A1 | 7/2002 | Cooke et al. |
| 2002/0097241 A1 | 7/2002 | McCormack et al. |
| 2002/0120723 A1 | 8/2002 | Forth et al. |
| 2002/0130863 A1 | 9/2002 | Baldwin |
| 2002/0138750 A1 | 9/2002 | Gibbs et al. |
| 2002/0140655 A1 | 10/2002 | Liang et al. |
| 2002/0143653 A1 | 10/2002 | DiLena et al. |
| 2002/0158869 A1 | 10/2002 | Ohba et al. ............. 345/423 |
| 2002/0158885 A1 | 10/2002 | Brokenshire et al. |
| 2002/0196251 A1 | 12/2002 | Duluk, Jr. et al. |
| 2002/0199110 A1 | 12/2002 | Kean |
| 2003/0020173 A1 | 1/2003 | Huff et al. |
| 2003/0023771 A1 | 1/2003 | Erickson et al. |
| 2003/0046472 A1 | 3/2003 | Morrow |
| 2003/0051091 A1 | 3/2003 | Leung et al. ............. 711/101 |
| 2003/0058244 A1 | 3/2003 | Ramani et al. |
| 2003/0061409 A1 | 3/2003 | RuDusky ............. 710/8 |
| 2003/0067468 A1 | 4/2003 | Duluk, Jr. et al. |
| 2003/0076325 A1 | 4/2003 | Thrasher |
| 2003/0093506 A1 | 5/2003 | Oliver et al. ............. 709/221 |
| 2003/0101288 A1 | 5/2003 | Tague et al. |
| 2003/0115500 A1 | 6/2003 | Akrout et al. |
| 2003/0122815 A1 | 7/2003 | Deering |
| 2003/0160795 A1 | 8/2003 | Alcorn et al. |
| 2003/0163589 A1 | 8/2003 | Bunce et al. |
| 2003/0164830 A1* | 9/2003 | Kent ............. 345/505 |
| 2003/0179631 A1 | 9/2003 | Koob et al. |
| 2003/0194116 A1 | 10/2003 | Wong et al. |
| 2003/0201994 A1 | 10/2003 | Taylor et al. |
| 2004/0012082 A1 | 1/2004 | Dewey et al. |
| 2004/0012597 A1 | 1/2004 | Zatz et al. |
| 2004/0046764 A1 | 3/2004 | Lefebvre et al. |
| 2004/0064628 A1 | 4/2004 | Chiu |
| 2004/0085313 A1 | 5/2004 | Moreton et al. |
| 2004/0102187 A1 | 5/2004 | Moller et al. |
| 2004/0130552 A1 | 7/2004 | Duluk, Jr. et al. |
| 2004/0183148 A1 | 9/2004 | Blasko ............. 257/415 |
| 2004/0183801 A1 | 9/2004 | Deering |
| 2004/0188781 A1 | 9/2004 | Bar ............. 257/415 |
| 2004/0196285 A1 | 10/2004 | Rice et al. |
| 2004/0196290 A1 | 10/2004 | Satoh |

(56) References Cited

U.S. PATENT DOCUMENTS

| | | | |
|---|---|---|---|
| 2004/0207642 A1 | 10/2004 | Crisu et al. | |
| 2004/0225787 A1 | 11/2004 | Ma et al. | |
| 2004/0227599 A1 | 11/2004 | Shen et al. | 335/78 |
| 2004/0246251 A1 | 12/2004 | Fenney et al. | |
| 2005/0030314 A1 | 2/2005 | Dawson | |
| 2005/0041031 A1 | 2/2005 | Diard | |
| 2005/0041037 A1 | 2/2005 | Dawson | |
| 2005/0044284 A1 | 2/2005 | Pescatore | |
| 2005/0045722 A1 | 3/2005 | Park | |
| 2005/0060601 A1 | 3/2005 | Gomm | |
| 2005/0066148 A1 | 3/2005 | Luick | |
| 2005/0088445 A1 | 4/2005 | Gonzalez et al. | |
| 2005/0122338 A1 | 6/2005 | Hong et al. | |
| 2005/0125629 A1 | 6/2005 | Kissell | |
| 2005/0134588 A1 | 6/2005 | Aila et al. | |
| 2005/0134603 A1 | 6/2005 | Iourcha et al. | |
| 2005/0172135 A1 | 8/2005 | Wiersma | |
| 2005/0173233 A1 | 8/2005 | Kaelberer | 200/181 |
| 2005/0174353 A1 | 8/2005 | Alcorn et al. | |
| 2005/0179698 A1 | 8/2005 | Vijayakumar et al. | |
| 2005/0182881 A1 | 8/2005 | Chou et al. | |
| 2005/0210472 A1 | 9/2005 | Accapadi et al. | |
| 2005/0237083 A1 | 10/2005 | Bakker et al. | |
| 2005/0246460 A1 | 11/2005 | Stufflebeam | |
| 2005/0259100 A1 | 11/2005 | Teruyama | |
| 2005/0275663 A1 | 12/2005 | Kokojima et al. | |
| 2005/0285863 A1 | 12/2005 | Diamond | |
| 2006/0033745 A1 | 2/2006 | Koselj et al. | |
| 2006/0044317 A1 | 3/2006 | Bourd et al. | |
| 2006/0053188 A1 | 3/2006 | Mantor et al. | |
| 2006/0053189 A1 | 3/2006 | Mantor | |
| 2006/0055641 A1 | 3/2006 | Robertus et al. | |
| 2006/0106911 A1 | 5/2006 | Chapple et al. | |
| 2006/0123177 A1 | 6/2006 | Chan et al. | |
| 2006/0132495 A1 | 6/2006 | Anderson | |
| 2006/0170690 A1 | 8/2006 | Leather | |
| 2006/0190663 A1 | 8/2006 | Lu | |
| 2006/0203005 A1 | 9/2006 | Hunter | |
| 2006/0221086 A1 | 10/2006 | Diard | |
| 2006/0245001 A1 | 11/2006 | Lee et al. | |
| 2006/0252285 A1 | 11/2006 | Shen | |
| 2006/0267981 A1 | 11/2006 | Naoi | |
| 2006/0267987 A1 | 11/2006 | Litchmanov | |
| 2006/0282604 A1 | 12/2006 | Temkine et al. | |
| 2007/0038794 A1 | 2/2007 | Purcell et al. | |
| 2007/0050647 A1 | 3/2007 | Conroy et al. | |
| 2007/0067535 A1 | 3/2007 | Liu | |
| 2007/0088877 A1 | 4/2007 | Chen et al. | |
| 2007/0115271 A1 | 5/2007 | Seo et al. | |
| 2007/0115290 A1 | 5/2007 | Polzin et al. | |
| 2007/0115291 A1 | 5/2007 | Chen et al. | |
| 2007/0139440 A1 | 6/2007 | Crow et al. | |
| 2007/0268298 A1 | 11/2007 | Alben et al. | |
| 2007/0273689 A1 | 11/2007 | Tsao | |
| 2007/0296725 A1 | 12/2007 | Steiner et al. | |
| 2008/0024497 A1 | 1/2008 | Crow et al. | |
| 2008/0024522 A1 | 1/2008 | Crow et al. | |
| 2008/0100618 A1 | 5/2008 | Woo et al. | |
| 2008/0198163 A1 | 8/2008 | Nakahashi et al. | |
| 2008/0273218 A1 | 11/2008 | Kitora et al. | |
| 2009/0044003 A1 | 2/2009 | Berthiaume et al. | |

FOREIGN PATENT DOCUMENTS

| | | |
|---|---|---|
| JP | H04266768 | 9/1992 |
| JP | 06180758 | 6/1994 |
| JP | 07-141526 | 6/1995 |
| JP | 0916840 | 6/1997 |
| JP | 10134198 | 5/1998 |
| JP | 11195132 | 7/1999 |
| JP | 11328133 | 11/1999 |
| JP | 2001-005989 | 1/2001 |
| JP | 2002076120 A2 | 3/2002 |
| JP | 2005182547 | 7/2005 |
| TW | 1235341 | 7/2005 |
| TW | 093127712 | 7/2005 |
| WO | 0013145 | 3/2000 |
| WO | 02054224 | 7/2002 |
| WO | 2005029329 | 3/2005 |

OTHER PUBLICATIONS

Eckert, et al; NVID-P000871RR.1.P1; Functional Component Coordinated Reconfiguration System and Method; U.S. Appl. No. 11/454,313; Filing date: Jun. 16, 2006.

Diamond, NVID-P001272; A Semiconductor Die Micro Electro-Mechanical Switch Management System; U.S. Appl. No. 10/942,209; Filing Date: Sep. 15, 2004.

Diamond, et al; NVID-P000871.4; A System and Method for Remotely Configuring Semiconductor Functional Circuits; U.S. Appl. No. 10/740,779; Filing date: Dec. 18, 2003.

Van Dyke, et al; NVID-P000871.1; An Integrated Circuit Configuration System and Method; U.S. Appl. No. 10/740,721; Filing Date: Dec. 18, 2003.

Diamond; NVID-P000871.6; Micro Electro Mechanical Switch System and Method for Testing and Configuring Semiconductor Functional Circuits; U.S. Appl. No. 10/942,169; Filing Date: Sep. 15, 2004.

Scotzniovsky, et al; NVID-P000871RR.2.P1; Functional Component Compensation Reconfiguration System and Method; U.S. Appl. No. 11/472,865; Filing Date: Jun. 21, 2006.

Diamond; NVID-P000871.5; A System and Method for Configuring Semiconductor Functional Circuits; U.S. Appl. No. 10/876,340; Filing date: Jun. 23, 2004.

Non-Final Office Action Dated Nov. 14, 2007; U.S. Appl. No. 10/740,721.

Non-Final Office Action Dated Jul. 24, 2008; U.S. Appl. No. 10/740,721.

Final Office Action Dated Apr. 30, 2009; U.S. Appl. No. 10/740,721.

Non-Final Office Action Dated Mar. 13, 2009; U.S. Appl. No. 11/454,313.

Non-Final Office Action Dated Dec. 3, 2008; Application No. 10/942,169.

Non-Final Office Action Dated Mar. 10, 2008; U.S. Appl. No. 11/474,161.

Final Office Action Dated Sep. 17, 2008; U.S. Appl. No. 11/474,161.

Non-Final Office Action Dated Feb. 20, 2009; U.S. Appl. No. 11/474,161.

Non-Final Office Action Dated Jul. 14, 2005; U.S. Appl. No. 10/740,779.

Non-Final Office Action Dated Jan. 10, 2006; U.S. Appl. No. 10/740,779.

Final Office Action Dated Aug. 7, 2006; U.S. Appl. No. 10/740,779.

Non-Final Office Action Dated Mar. 26, 2007; U.S. Appl. No. 10/740,779.

Final Office Action Dated Dec. 6, 2007; U.S. Appl. No. 10/740,779.

Notice of Allowance Dated Jun. 9, 2008; U.S. Appl. No. 10/740,779.

Non-Final Office Action Dated Sep. 26, 2008; U.S. Appl. No. 10/740,779.

Notice of Allowance Dated Jul. 20, 2009; U.S. Appl. No. 10/740,779.

Non-Final Office Action Dated Feb. 6, 2006; U.S. Appl. No. 10/942,209.

Final Office Action Dated Sep. 11, 2006; U.S. Appl. No. 10/942,209.

Non-Final Office Action Dated Mar. 29, 2007; U.S. Appl. No. 10/942,209.

Non-Final Office Action Dated Dec. 21, 2007; U.S. Appl. No. 10/942,209.

Non-Final Office Action Dated Jul. 14, 2008; U.S. Appl. No. 10/942,209.

Final Office Action Dated Mar. 17, 2009; U.S. Appl. No. 10/942,209.

Non-Final Office Action Dated Aug. 5, 2009; U.S. Appl. No. 10/942,209.

Non-Final Office Action Dated Feb. 9, 2007; U.S. Appl. No. 10/942,169.

Notice of Allowance Dated Aug. 10, 2007; U.S. Appl. No. 10/942,169.

(56) References Cited

OTHER PUBLICATIONS

Notice of Allowance Dated Nov. 21, 2007; U.S. Appl. No. 10/942,169.
Notice of Allowance Dated Mar. 18, 2008; U.S. Appl. No. 10/942,169.
Notice of Allowance Dated Aug. 8, 2008; U.S. Appl. No. 10/942,169.
Notice of Allowance Dated Nov. 28, 2008; U.S. Appl. No. 10/942,169.
Notice of Allowance Dated Apr. 24, 2009; U.S. Appl. No. 10/942,169.
Non-Final Office Action Dated Oct. 5, 2006; U.S. Appl. No. 10/876,340.
Final Office Action Dated May 23, 2007; U.S. Appl. No. 10/876,340.
Notice of Allowance Dated Dec. 4, 2007; U.S. Appl. No. 10/876,340.
Notice of Allowance Dated Apr. 29, 2008; U.S. Appl. No. 10/876,340.
Notice of Allowance Dated Sep. 4, 2008; U.S. Appl. No. 10/876,340.
Notice of Allowance Dated Jan. 12, 2009; U.S. Appl. No. 10/876,340.
Notice of Allowance Dated May 14, 2009; U.S. Appl. No. 10/876,340.
Non-Final Office Action Dated Jan. 11, 2006; U.S. Appl. No. 10/740,722.
Non-Final Office Action Dated Oct. 11, 2006; U.S. Appl. No. 10/740,722.
Notice of Allowance Dated May 30, 2007; U.S. Appl. No. 10/740,722.
Notice of Allowance Dated Sep. 18, 2007; U.S. Appl. No. 10/740,722.
Notice of Allowance Dated Nov. 21, 2007; U.S. Appl. No. 10/740,722.
Notice of Allowance Dated Mar. 14, 2008; U.S. Appl. No. 10/740,722.
Notice of Allowance Dated Aug. 21, 2008; U.S. Appl. No. 10/740,722.
Notice of Allowance Dated Dec. 22, 2008; U.S. Appl. No. 10/740,722.
Notice of Allowance Dated Apr. 16, 2009; U.S. Appl. No. 10/740,722.
Non-Final Office Action Dated Dec. 23, 2008; U.S. Appl. No. 12/005,691.
Final Office Action Dated Jul. 8, 2009; U.S. Appl. No. 12/005,691.
Non-Final Office Action Dated Mar. 17, 2008; U.S. Appl. No. 11/474,027.
Final Office Action Dated Oct. 8, 2008; U.S. Appl. No. 11/474,027.
Non-Final Office Action Dated Mar. 19, 2009; U.S. Appl. No. 11/474,027.
U.S. Appl. No. 10/956,609; Acocella et al., filed Sep. 30, 2004.
Non Final Office Action; Mail Date Mar. 26, 2010; U.S. Appl. No. 11/454,313.
Non Final Office Action; Mail Date Sep. 14, 2009; U.S. Appl. No. 11/454,313.
Final Office Action; Mail Date Sep. 4, 2009; U.S. Appl. No. 11/472,865.
Final Office Action dated Jul. 12, 2010; U.S. Appl. No. 10/740,721.
Final Office Action Dated Feb. 28, 2011, U.S. Appl. No. 10/740,721.
International Search Report, PCT/US2004/030127, Mail Date Jun. 30, 2005.
PCT International Preliminary Report on Patentability, PCT/US2004/030127, International filing date Sep. 13, 2004, Applicant: Nvidia Corporation, date of Issuance of this Report: Mar. 16, 2006.
"Addressing the System-on-a-Chip Interconnect Woes Through Communication-Based Design" by Sgrol et al., DAC 2001, Jun. 18-22, 2001, copyright ACM.
"OSI Reference Model-The ISO Model of Architecture for Open Systems Interconnection," by Zimmermann, IEEE Transactions on Communicaions, Apr. 1980.
"SuperPaint: An Early Frame Buffer Graphics System", by Richard Shoup, IEEE Annals of the History of Computing, copyright 2001.
"Multimedia Processors" by Kuroda et al., Proceedings of the IEEE, Jun. 1998.
"Test Requirements for Embedded Core-based Systems and IEEE P1500" by Yervant Zorian, International Test Conference,copyright IEEE 1997.
PCI Express Card Electromechanical Specification Rev. 1.1, 2005, p. 87.
A parallel algorithm for polygon rasterization Juan Pineda Jun. 1988 ACM.
A VLSI architecture for updating raster-scan displays Satish Gupta, Robert F. Sproull, Ivan E. Sutherland Aug. 1981 ACM SIGGRAPH Computer Graphics, Proceedings of the 8th annual conference on Computer graphics and interactive techniques SIGGRAPH '81, vol. 15 Issue 3 Publisher: ACM Press.
Blythe, OpenGL Section 3.4.1, "Basic Line Segment Rasterization", Mar. 29, 1997, pp. 1-3.
A hardware assisted design rule check architecture Larry Seiler Jan. 1982 Proceedings of the 19th conference on design automation DAC '82 Publisher: IEEE Press.
Foley, J. "Computer Graphics: Principles and Practice", 1987, Addison-Wesley Publishing, 2nd Edition, p. 545-546.
Fuchs; "Fast Spheres Shadow, Textures, Transparencies, and Image Enhancements in Pixel-Planes"; ACM; 1985; Department of Computer Science, University of North Carolina at Chapel Hill, Chapel Hill, NC 27514.

\* cited by examiner

| | 11 | 12 | 13 | 14 | 15 | 16 | 17 | 18 |
|---|---|---|---|---|---|---|---|---|
| Yield Mask 20 | | 98 | | | | | | |
| Compatibility Mask 30 | | | | 99 | | | | |
| Performance Mask 40 | | 97 | | | | | | |
| Self Healing Mask 50 | | | | | | | | |

SYSTEM AND METHOD FOR INCREASING DIE YIELD

RELATED APPLICATIONS

This application claims the benefit of commonly-owned U.S. Patent Provisional Application Ser. No. 60/503,710, filed Sep. 15, 2003, entitled "A SYSTEM AND METHOD FOR CONFIGURING SEMICONDUCTOR FUNCTIONAL COMPONENTS" which is hereby incorporated by this reference.

This application is also related to the following Applications:

U.S. patent application Ser. No. 10/740,721, entitled "AN INTEGRATED CIRCUIT CONFIGURATION SYSTEM AND METHOD", filed on Dec. 12, 2003;

U.S. patent application Ser. No. 10/740,722, entitled "A SYSTEM AND METHOD FOR CONFIGURING SEMICONDUCTOR FUNCTIONAL CIRCUITS", filed on Dec. 18, 2003;

U.S. patent application Ser. No. 10/740,779, entitled "A SYSTEM AND METHOD FOR REMOTELY CONFIGURING SEMICONDUCTOR FUNCTIONAL CIRCUITS", filed on Dec. 18, 2003;

U.S. patent application Ser. No. 10/876,340, entitled "SYSTEM AND METHOD FOR TESTING AND CONFIGURING SEMICONDUCTOR FUNCTIONAL CIRCUITS", filed on Jun. 23, 2004;

U.S. patent application Ser. No. 10/942,169, entitled "MICRO ELECTRO MECHAMCAL SWITCH SYSTEM AND METHOD FOR TESTING AND CONFIGURING SEMICONDUCTOR FUNCTIONAL CIRCUITS", filed on Dec. 15, 2004;

U.S. patent application Ser. No. 11/454,313, entitled "FUNCTIONAL COMPONENT COORDINATED RECONFIGURATION SYSTEM AND METHOD", filed on Jun. 16, 2006;

U.S. patent application Ser. No. 11/472,865, entitled "FUNCTIONAL COMPONENT COMPENSATION RECONFIGURATION SYSTEM AND METHOD", filed on Jun. 21, 2006; and U.S. patent application Ser. No. 10/942,209, entitled "SEMICONDUCTOR DIE MICRO ELECTRO-MECHANICAL SWITCH MANAGEMENT SYSTEM AND METHOD", filed on Sep. 15, 2004;

FIELD OF THE INVENTION

The present invention relates to the field of semiconductor manufacturing. In particular, the present invention relates to a system and method for dynamically configuring operational characteristics of functional components within an integrated circuit.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data in most areas of business, science, education and entertainment. Electronic systems providing these advantageous results often include integrated circuits. It is desirable to utilize integrated circuits with very high reliability characteristics to prevent erroneous results. However, designing and building integrated circuits with diverse functionality and performance characteristics is challenging. Additionally, the manufacturing process to build the integrated circuits is highly complex and resource intensive.

Manufacturing integrated circuits is an expensive, resource intensive activity, in which numerous computational components are included in a single integrated circuit unit. The computational components are usually required to be capable of performing a variety of tasks with very high reliability. Various applications often require different performance levels and functionality. Traditionally, each die is fabricated with a predetermined quantity of properly performing components providing set functionality. However, providing appropriate and efficient functionality at acceptable reliability is often difficult. For example, many traditional approaches require that there be few or no defective components included in the integrated circuit.

Conventionally, integrated circuits are manufactured in wafers comprising a number of die, with each die comprising an integrated circuit having numerous functional components. The number of die that are functionally acceptable from a given wafer is referred to as the yield from the wafer. It is desirable to maintain relatively high yields in order to eliminate waste, save cost and speed-up the effective manufacturing time for a given number of die. Yields for wafers with high performance die with a large number of components can be very low.

One method used by memory chip makers for mitigating the impact of the occurrence of defective components within an integrated circuit die is to produce the die with more components, e.g. memory cells, than required. If there is a defective component the defective component is disconnected and one of the "surplus" components is utilized. This approach usually results in considerable waste of precious die area and resources on fabricating components that remain "surplus" even after replacing defective components. Such surplus components do not contribute to functionality and/or operational productivity. A significant number of die end up having numerous "surplus" components with perfectly good operational capabilities that are not utilized.

Another traditional attempt at addressing defective components is to remove functional capability if one functional component associated with a particular function is defective. For example, if a floating point acceleration component of a processor is defective, the floating point acceleration functionality is removed or disabled using conventional repair techniques, and the processor becomes a non-floating point acceleration processor. In addition, the end result is a usable integrated circuit with limited capability and that does not provide a full range of functionality (e.g., not able to perform floating point operations).

SUMMARY

The present invention systems and methods enable configuration of functional components in integrated circuits. A present invention system and method can flexibly change the operational characteristics of functional components in an integrated circuit die based upon a variety of factors including manufacturing defects, compatibility characteristics, performance requirements, and system health (e.g., the number of components operating properly). In one embodiment, a present invention configuration system includes functional components, a distribution component, a functional component configuration controller and optionally a collection component. The functional components perform processing operations (e.g., graphics processing operations, floating point operations, etc.). The distribution component distributes workflow information (e.g., graphics processing information, floating point processing information, etc.) to the functional components. The functional component configuration controller configures operational characteristics of the functional components. The collection component "collects" the output or results from the functional components and aggregates the results of the operations for use in achieving a common objective.

In one exemplary implementation, the changes to operational characteristics of a functional component are coordinated with changes to other functional components. Workflow scheduling and distribution is also adjusted based upon the changes to the operational characteristics of the functional components. For example, the functional component configuration controller changes the operational characteristics settings and provides an indication of the changes to a workflow distribution component. The workflow distribution component changes the workflow schedule based upon the operational characteristics settings. For example, the work flow is diverted to or away from particular functional components.

The present invention system and method enable integrated circuit chips with defective functional components to be salvaged and facilitate increased wafer yield in integrated circuit manufacturing in one embodiment. Traditionally, the integrated circuits with the defective functional components would otherwise be discarded resulting in the costs of producing a wafer being assigned to fewer acceptable die. In one embodiment, a present invention system and method disables defective functional components in the die in a manner that maintains the basic functionality of the chip.

In one embodiment of the present invention, integrated circuit salvaging is performed in conjunction with chip testing. A chip is tested (e.g., in accordance with a built in self test) and defective functional components of the chip are identified. A determination is made if a defective functional component is one which does not have another functional component included in the die that is similar. In one embodiment, a distinction is made if the die does not have another functional component that can handle the work flow if the defective functional component is disabled. If such a defective functional component is identified, the die may be discarded since the die could not provide full functionality. If other functional components exist that can be used to perform the functionality of the defective component, a functional component configuration process (e.g., functional component configuration process 400) is performed on the chip based upon results of the testing.

In one embodiment of the present invention, the functional component configuration process disables defective functional components included in a chip. An indication of the defective functional component identification is received. A determination is made if the defective functional component is one of a plurality of similar functional components. In one embodiment of the present invention, the identified defective component (e.g., a pixel shader, vertex processor, floating point component, etc.) is compared against a list of other similar components that can provide the same functionality. In one exemplary implementation, the other similar components are examined to determine if they are parallel components to the defective functional component. The defective functional component is disabled if it is one of the plurality of similar functional components and another component can handle the workflow that would otherwise be assigned to the defective component. In one embodiment of the present invention, functional components associated with the defective component can also be disabled (e.g., to maintain product differentiation). Workflow is diverted from the disabled component.

In one embodiment, diverting the workflow is accomplished by providing notification of the disablement to a component that otherwise communicates information to the defective functional component. For example, a disabling component provides an indication (e.g., a bit map) to the distributor component and the distributor component does not provide information to the defective functional component. Instead, the work flow is diverted to other similar functional components.

In one embodiment of a present invention salvage method, definitions of characteristics of a die for a particular performance level are included and a die is marked accordingly. In one exemplary implementation, the test includes an indication of what defects are permissible in each performance level. For example, the test can include a first performance level in which a first plurality of parallel functional components can be disabled and a second performance level in which a second plurality of parallel functional components can be disabled. The present invention can also facilitate automatic binning of the die based upon performance levels as part of the testing procedure.

In one embodiment, centralized resources are utilized in the configuration of remote integrated circuits. A remote functional component configuration architecture facilitates configuration of functional components included in a remotely located integrated circuit die. In one exemplary implementation a die functional component reconfiguration request process is engaged in wherein a system requests a reconfiguration code from a remote resource. The code request includes a reconfiguration code permission indicator that indicates the requester is authorized to receive a reconfiguration code (e.g., the requester has made a requisite payment, has an authorized system, etc.). A reconfiguration code production process is executed in which a request for a reconfiguration code and a permission indicator are received, validity of the permission indicator is analyzed, and a reconfiguration code is provided. A die functional component reconfiguration process is performed on the die when an appropriate reconfiguration code is received by the die.

DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 1D is a block diagram of an exemplary mask array implementation in accordance with one embodiment of the present invention to control different objectives.

DETAILED DESCRIPTION

Figure 1A:
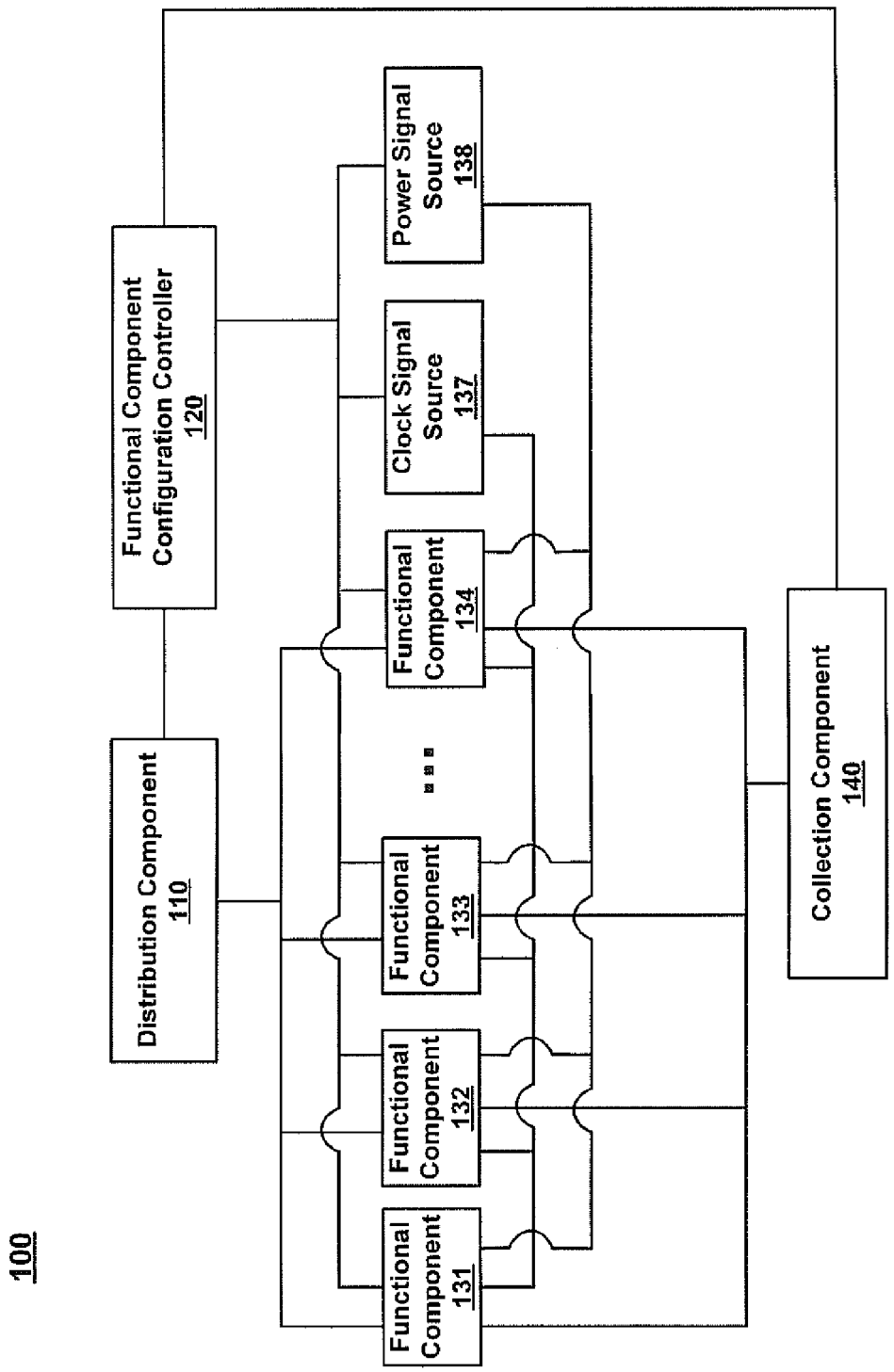
FIG. 1A is a block diagram of an integrated circuit in accordance with one embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

FIG. 1A is a block diagram of integrated circuit 100 in accordance with one embodiment of the present invention. Integrated circuit 100 comprises distribution component 110, functional component configuration controller 120, collection component 140 and functional components 131, 132, 133 and 134. Distribution component 110 is coupled to functional components 131, 132, 133 and 134, which are coupled to collection component 140. Functional component configuration controller 120 is coupled to distribution component 110, functional components 131, 132, 133 and 134, and collection component 140. In one embodiment of the present invention, the components of integrated circuit 100 are included in a single die. The components of integrated circuit 100 cooperatively operate to perform information processing (e.g., data manipulation). In one exemplary implementation, the components of integrated circuit 100 perform information processing related to a common objective (e.g., graphics pipeline processing associated with producing an image).

Distribution component 110 selectively distributes information to functional components 131-134 (e.g., enabled functional components). It is appreciated that distribution component 110 can distribute a variety of information. For example, distribution component 110 can distribute workflow information. The workflow information can be information or data for processing in association with a common objective. For example, the workflow information can be graphics related information (e.g., a single stream of information in which various parts of the information stream include pixel information for sequentially configured pixels of an image). In one exemplary implementation, distribution component 110 receives a single stream of workflow information or data (e.g., graphics data) and distributes the workflow information to functional components 131-134. For example, the single stream of information can include information related to a first pixel, a second pixel, and a third pixel. Distribution component 110 receives the single stream of pixel information (e.g., a sequence of packets) and distributes the information (e.g., as individual packets) related to the first pixel to functional component 131, the information related to the second pixel to functional component 132 and the information related to the third pixel to functional component 133. In another exemplary implementation, the distribution component 110 receives a single stream of information related to floating point calculations and distributes information associated with a first floating point calculation to functional component 131, information associated with a second floating point calculation to functional component 132, and information associated with a third floating point calculation to functional component 133. In one embodiment, distribution component 110 can also receive multiple information streams and distribute the information to the functional components 131-134. It is appreciated that distribution component 110 can be implemented in a variety of embodiments, including embodiments in which distribution component 110 provides functions or performs tasks in addition to distributing the workflow information.

Functional components 131-134 can include a variety of implementations in which the functional components 131-134 perform different functional operations or tasks. In one embodiment functional components 131-134 provide similar functionality (e.g., perform parallel operations). For example, in one embodiment functional components 131-134 can perform graphics processing related tasks (e.g., shading, texturing, occlusion culling, etc). In another embodiment, functional components 131-134 can perform floating point related processing.

Collection component 140 "collects" the output or results from functional components 131-134. In one embodiment, collection component 140 concatenates or aggregates the results of the operations for use in achieving the common objective. For example, the collection component 140 can aggregate the results for communication to a graphics buffer. In another embodiment, the collection component 140 is a graphics buffer. In yet another embodiment, collection component 140 can aggregate the results of floating point calculations.

The components of integrated circuit 100 also cooperatively operate to flexibly configure functional component operational characteristics (e.g., enable/disable a functional component, change clock speed, change operating voltage, etc.). Functional component configuration controller 120 controls adjustments in operational characteristics (e.g., disable/enable, etc.) of one or more of the functional components 131-134 and can provide information to distribution component 110 and collection component 140 regarding the adjustment. For example, functional component configuration controller 120 can disable or enable a functional component (e.g., disable or enable functional component 132). Functional component configuration controller 120 can notify distribution component 110 of the change to functional component 132 operating characteristics (e.g., which of the functional components is enabled, disabled, etc.).

Distribution component 110 can use information about the operational characteristics of functional component 132 in distributing workflow information. In one embodiment, the distribution component 110 can factor the configuration of the functional components into distribution of information (e.g., workflow including data for processing) to the functional components. If one of the processor functional components is disabled (e.g., because it is defective), distribution component 110 distributes the information to the other remaining processor functional components to handle the "work flow". For example, if functional component 132 is disabled by functional component configuration controller 120, distribution component 110 is notified that functional component 132 is disabled and distribution component 110 can route workflow to other functional components (e.g., 131, 133, and/or 134). If functional component 132 is enabled by functional component configuration controller 120, distribution component 110 is notified that functional component 132 is enabled and distribution component 110 can route workflow to functional component 132. Distribution component 110 can also distribute the information to remaining enabled functional components based upon the performance configuration (e.g., clock speed) of the functional components. In one exemplary implementation, tasks with greater performance demands (e.g., critical tasks) are routed to functional components with greater performance characteristics or capabilities (e.g., faster). For example, three dimensional (3D) graphics information can be routed to a high performance (e.g., high speed) graphics pipeline and two dimensional (2D) graphics information can be routed to a lower performance (e.g., slower speed) graphics pipeline. In one embodiment the information is distributed in accordance with scoreboarding algorithms.

In one embodiment of the present invention, functional component configuration controller 120 directs changes to operational characteristics of functional components 131-134. The operational characteristics can impact the performance of functional components 131-134. For example, functional component configuration controller 120 can change an operational characteristic state of functional components 131-134 (e.g., enable or disable the functional component). In one exemplary implementation, functional component configuration controller 120 can alter the speed at which a functional component operates (e.g., by changing a clock frequency) and/or the power consumed by a functional component (e.g., by changing the voltage supplied to the functional component). For example, functional component configuration controller 120 can direct clock source 137 to change a frequency of a clock signal supplied to functional components 131-134 and/or power supply 138 to change the voltage of a power signal supplied to functional components 131-134.

It is appreciated that the present invention is readily adaptable for utilization with a variety of functional components. Functional components 131-134 can be functional units that provide a variety of different functions (e.g., floating point, pixel shading, vertex shading, storage, buffering, etc.). In one exemplary implementation, the functional components can perform similar operations at substantially the same time (e.g., concurrently in parallel). In one embodiment of the present invention, the functional components are active functional components.

In one embodiment, the functional components are processor components (e.g., floating point components, pixel shader components, vertex processor components, etc.) included in a processing unit. It is appreciated that the present invention can be readily implemented in a variety of processing units, including a central processing unit (CPU), a graphics processing unit (GPU), and/or an embedded processing unit. In one exemplary implementation, the processing unit includes a scoreboarding algorithm for allocating tasks to the processor functional components (e.g., floating point components). As results are processed by the processor functional components the scoreboard tracks which operand is required by a processor functional component and schedules it. The results from the individual processor functional components can be combined to provide an overall result. The scoreboard can factor a functional component configuration into the scheduling of tasks. For example, if one of the processor functional components is disabled (e.g., because it is defective), the scoreboard reschedules the other remaining processor functional components to handle the processing work flow.

Figure 1B:
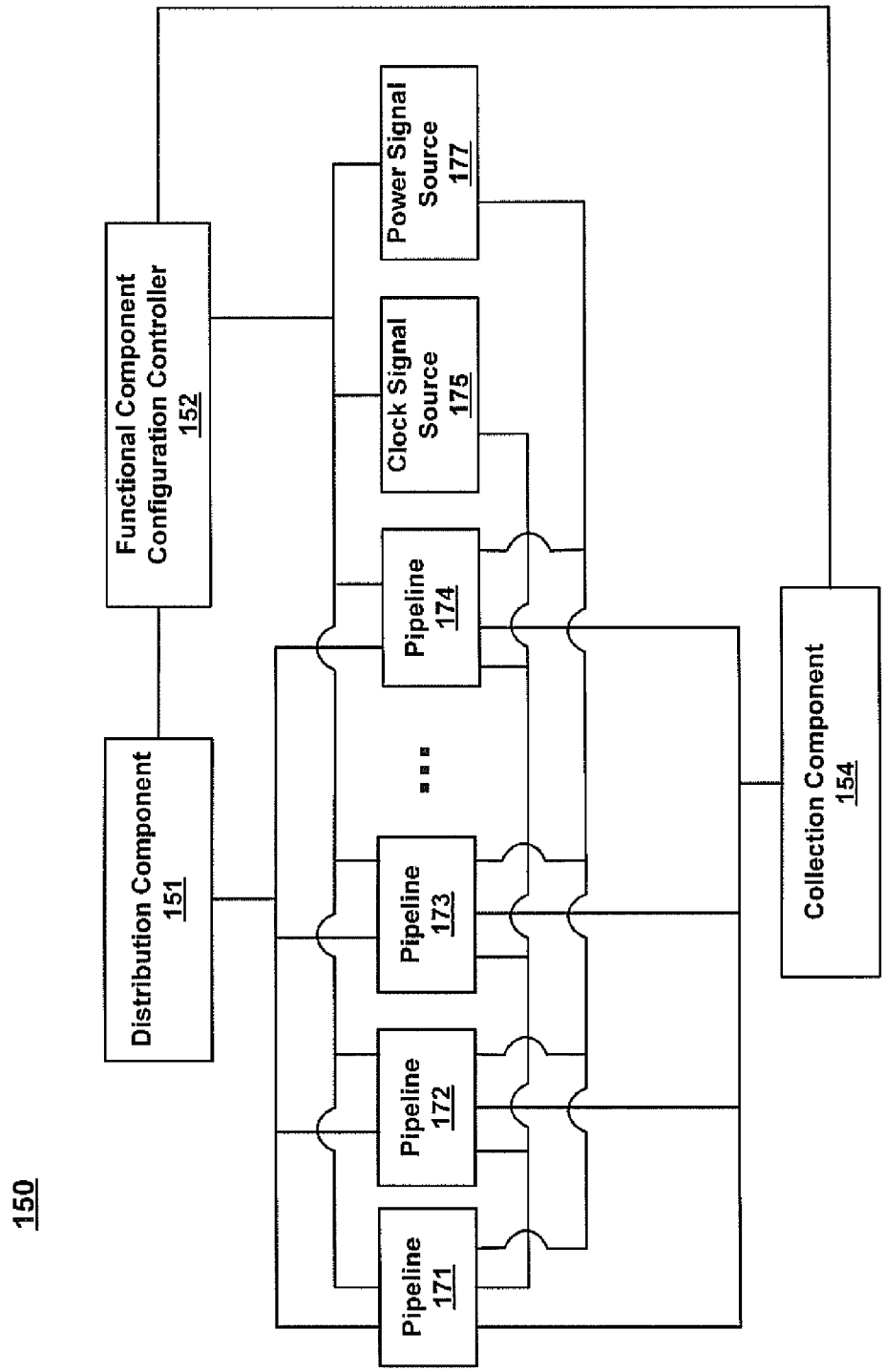
FIG. 1B is a block diagram of an integrated circuit having functional components organized in pipelines in accordance with one embodiment of the present invention.

The present invention can be implemented in a pipeline type (e.g., a vector type, thread type, etc.) processing environment. FIG. 1B is a block diagram of pipeline integrated circuit 150 in accordance with one embodiment of the present invention. Pipeline integrated circuit 150 is an implementation of integrated circuit 100 in which the functional components are pipelines. Integrated circuit 150 comprises distribution component 151, functional component configuration controller 152, collection component 154 and pipelines 171, 172, 173 and 174. Pipelines 171, 172, 173 and 174 perform pipeline operations (e.g., fetch, decode and execute instructions). Functional component configuration controller 152 controls the operational characteristics of pipelines 171 through 174 and also provides information to distribution component 151 and collection component 154 regarding operational characteristics of pipelines 171 through 174 (e.g., information regarding which of the functional components is disabled and/or enabled). The control of operational characteristics can be performed at varying granularity. For example, a pipeline can include multiple individual functional components (not shown) within each pipeline which can also be configured (e.g., enabled, disabled, etc.) on an individual functional component basis.

The components of pipeline integrated circuit 150 operate similar to the components of integrated circuit 100. For example, workflow information is diverted or routed in a similar manner. Functional component configuration controller 152 provides information to distribution component 151 regarding the operational characteristics of the functional components 171-174 (e.g., disabled, enabled, speed, voltage, etc). Distribution component 151 distributes information to the pipelines 171-174 based in part upon the operation characteristic information (e.g., distributes workflow information to enabled functional components and not disabled functional components). Collection component 140 "collects" (e.g., concatenates or aggregates) the output of pipelines 171-174 (e.g., concatenates or aggregates the results for storage in a graphics buffer). In one embodiment, functional component configuration controller 152 can direct clock source 175 to change a frequency of a clock signal supplied to functional components 171-174 and/or power supply 177 to change the voltage of a power signal supplied to functional components 171-174.

Figure 1C:
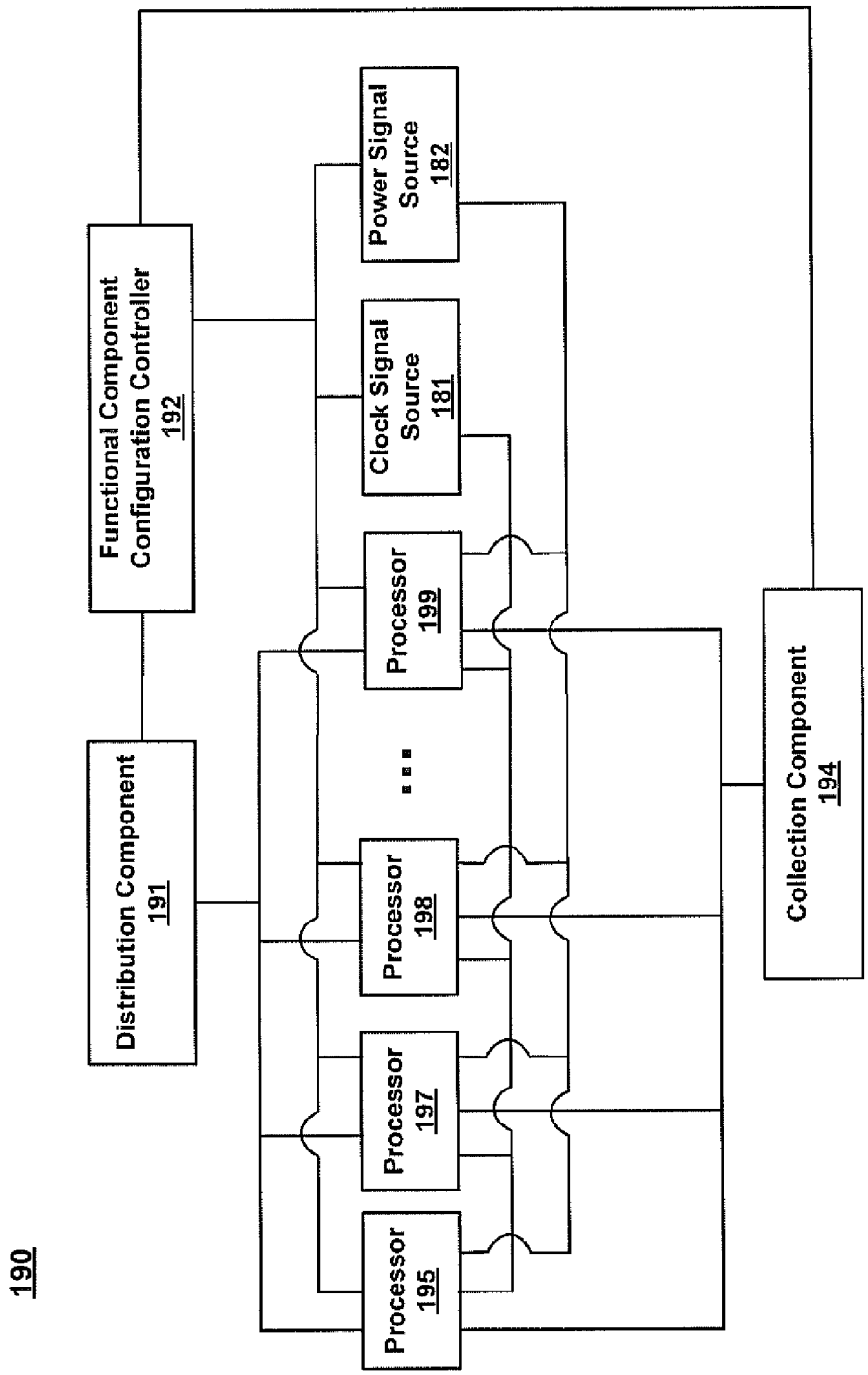
FIG. 1C is a block diagram of a multiprocessor integrated circuit in accordance with one embodiment of the present invention.

A present invention integrated circuit can be implemented at a variety of integration levels (e.g., a variety of die hierarchies and architectures). FIG. 1C is a block diagram of multiprocessor integrated circuit 190, another embodiment of a present invention die hierarchy. The components of multiprocessor integrated circuit 190 are similar to integrated circuit 100 except the functional components are processors. Multiprocessor integrated circuit 190 comprises distribution component 191, functional component configuration controller 192, collection component 194 and processors 195, 197, 198 and 199. In one embodiment, processors 195, 197, 198 and 199 are included in a single die and coupled to a common cache memory. Functional component configuration controller 192 can direct operational characteristics adjustments (e.g., disables/enables) to one or more of the processors 195-199 and provides operational characteristic information to distribution component 191 and collection component 194 indicating the operational characteristics of processors 195-199 (e.g., indicates if a processor is disabled/enabled). In one exemplary implementation, integrated circuit 190 still provides complete functionality even if functional component configuration controller 192 disables a processor (e.g., 195, 197, 198, or 199).

The components of multiprocessor integrated circuit 190 operate similar to the components of integrated circuit 100. For example, workflow information is diverted or routed in a similar manner. Functional component configuration controller 192 provides information to distribution component 191 regarding operational characteristics of the functional components (e.g., disabled, enabled, speed, voltage, etc). Distribution component 191 distributes information (e.g., workflow data) to the processors 195-199. The distribution is based in part upon the operation characteristic information (e.g., distributes workflow information to enabled functional components and not disabled functional components). In one exemplary implementation, collection component 194 is a memory (e.g., a common cache) which "collects" or stores the output of processors 195-199. In one embodiment, functional component configuration controller 192 can direct clock source 181 to change a frequency of a clock signal supplied to functional components 195-199 and/or power supply 182 to change the voltage of a power signal supplied to functional components 195-199.

A distinction is made between performance and functionality in one embodiment of the present invention. In some instances, the present invention does not limit functionality when changing operational characteristics in the sense that a particular type of function or task is still capable of being performed even though the function or task may be accomplished at a different performance level. In one embodiment, a functional component configuration controller does not disable all the functional components capable of performing tasks in parallel. For example, if a die has two parallel floating point functional components in a processor and functional component configuration alters the enablement characteristic or state (e.g., disables) one of the floating point functional components, the work flow is "rerouted" to the remaining enabled floating point functional components. The performance level of floating point activities may change (e.g., slow down) since the work flow is being handled by one floating point functional component instead of two. However, the die still has the ability to provide the same functionality or task (e.g., perform the floating point functions).

In one embodiment of the present invention, integrated circuits (e.g., integrated circuit 100, integrated circuit 150, integrated circuit 190, etc.) are marked with a performance indicator that corresponds to the performance capabilities (e.g., the number of functional components that are enabled and/or disabled). The marking can be an electronically readable marking and/or an ink marking (e.g., on a die). The marking can be an indicator of the quality rating of the integrated circuit. The marking can also correspond to a performance metric associated with the integrated circuit (e.g., a processing speed, bandwidth, etc.).

It is appreciated that the functional component configuration controllers 120, 152, and/or 192 can direct functional component changes in accordance with a variety of objectives. For example, a functional component configuration controller can alter operational characteristics of functional components based upon yield issues, compatibility issues, performance issues, system "health" issues, etc. It is also appreciated that functional component configuration controllers 120, 152, and/or 192 can include a variety of implementations to achieve the objectives, including a software programmable register or mask, hardcoded mask, etc.

In one embodiment, a functional component configuration controller (e.g., 120, 152 and/or 192) directs changes in the operational characteristics of functional components to address yield issues. The present invention has the benefit of facilitating increased wafer yield in integrated circuit manufacturing. A present invention system and method enables integrated circuits with some defective functional components to be salvaged. Traditionally, die with defective functional components are discarded resulting in the costs of producing a wafer being assigned to fewer acceptable die. The present invention permits some die with defective functional units to be used to perform the same types of functions and thereby maintain functionality even though the disablement of the defective components may impact performance. Increasing the number of useful die on a wafer permits the cost of wafer production to be assigned to a greater number of acceptable die. By permitting the fixed cost of wafer production to be assigned to a greater number of die, the cost per die can decrease, even though the lower performing die may be sold at a lower price.

The present invention facilitates "salvaging" of die even though some of the die may operate at different performance levels. In one exemplary implementation, the die that would otherwise be discarded are able to provide the same functionality in the sense that the die execute the same type of tasks. For example, a processor with parallel floating point functional components capable of performing floating point operations is still able to perform floating point operations since in one embodiment the present invention does not disable all the parallel floating point components and "reroutes" workflow from the disabled parallel floating point components to the remaining floating point components. Die with more disabled components may perform the tasks at a different level (e.g., slower) because some parallel components are disabled. However, the die still has the ability to provide the same functionality (e.g., perform the same tasks).

In one embodiment, a functional component configuration controller (e.g., 120, 152 and/or 192) directs operational characteristic changes (e.g., enable, disable, etc.) to functional components during manufacturing testing. For example, a functional component configuration controller (e.g., 120, 152 or 192) disables a functional component (e.g., 132, 173, or 198 respectively) if testing indicates the functional component is defective and enables a functional component (e.g., 131, 174, 197 respectively) if testing indicates the functional component is not defective.

In one embodiment of the present invention, a functional component configuration controller (e.g., 120, 152 and/or 192) directs changes in the operational characteristics of functional components to address "self health" issues. In one exemplary implementation, the functional component controller addresses self health issues in the "field" or after initial shipment from the manufacturer. In one exemplary implementation, an integrated circuit is capable of running in the field "self-health" tests. For example, if a "self-health" test results in an indication of a defective functional component, a functional component configuration controller (e.g., 120, 152 and/or 192) disables the defective functional component and provides an indication that the functional component is disabled to a distribution component (e.g., 110, 150, or 191). In one embodiment of the present invention, the self health test is compliant with International Electrical and Electronic Engineering (IEEE) Standard 1149.1 (also referred to as Joint Task Action Group (JTAG) testing). In an alternate embodiment, the self health test is a proprietary test for checking the operational integrity of the system. In yet another embodiment, a functional component is enabled if a "self health" test in the field indicates the functional component is not defective.

In yet another embodiment, if a non-enabled non-defective functional component that performs similar types of tasks or functions as a defective functional component is available, the non-enabled non defective functional component is enabled if the defective component is disabled. For example, integrated circuit 100 of FIG. 1 can be initially shipped with functional components 131 and 132 enabled and functional components 133 and 134 disabled even through they are non defective (e.g., for market segmentation reasons, etc.). If a field self health test later indicates that functional component 132 becomes defective, functional component controller 120 can disable functional component 132 and enable functional component 133 and work flow that would have flowed to functional component 132 if it was not disabled is distributed (e.g., by distribution component 110) to functional component 133. Thus, disabling functional component 132 in effect removes the problems associated with defects in functional component 132, while enabling previously disabled functional component 133 permits the same type of functionality or tasks to be performed on the workflow at the same performance level and thereby the system is effectively "self healing".

In one embodiment of the present invention, a functional component configuration controller (e.g., 120, 152 and/or 192) directs changes in the operational characteristics of functional components to address compatibility issues. In one embodiment, a functional component controller included in a graphics accelerator is capable of recognizing chipsets that are compatible with features of the graphics accelerator and changes operational characteristics of the graphics accelerator accordingly. For example, if the functional component configuration controller is controlling operational characteristics of graphics pipelines, the functional component configuration controller can enable a higher number of graphics pipelines if the chip set supports it and is compatible with the utilization of a higher number of graphics pipelines. For example, a graphics accelerator and a chip set are manufactured by the same manufacturer and the functional component controller included in the graphics accelerator can receive a signal identifying a chip set included in the same system as the graphics accelerator. In one embodiment of the present invention, compatibility is established by a driver and a functional component controller directs changes to the operational characteristics of the functional components accordingly.

In one embodiment of the present invention, a functional component configuration controller (e.g., 120, 152 and/or 192) directs changes in the operational characteristics of functional components to address performance issues. In one embodiment, performance mask 40 provides an indication of operational characteristics for functional components based upon performance issues. For example, a particular application is being run and desirable supported functional component operational characteristics are enabled. If the application is a graphics application additional graphics pipelines can be enabled and/or the clock speed of existing graphics application pipelines can be increased. In one embodiment of the present invention, the type of the system can be factored into performance operational changes, for example in mobile devices the performance can be adjusted to conserve power.

It is appreciated that there are a variety of functional component configuration controller embodiments for implementing functional component changes in accordance with different objectives. FIG. 1D is a block diagram of mask array 10 utilized by a functional component controller in accordance with one embodiment of the present invention to control different objectives. Each mask in the mask array can correspond to a particular operational objective. In one exemplary implementation, mask array 10 comprises yield mask 20, compatibility mask 30, performance mask 40, and self healing mask 50. In one exemplary implementation, each column 11 through 18 is associated with one of eight functional components. Each cell (e.g., cell 99) includes an operational characteristic setting value. For example, an operational characteristic setting value of logical one can correspond to enabling the functional component, a high clock speed for the component, a high voltage level for the component, etc. Conversely an operational characteristic setting value of logical zero can correspond to disabling the functional component, a low clock speed for the component, a low voltage level for the component, etc. It is appreciated that the present invention is readily adaptable for operational characteristic setting values that have varying increments of granularity (e.g., very high speed, high speed, medium speed, low speed, very low speed). In one exemplary implementation, mask array 10 is implemented in a register array.

Priorities can be assigned to the different objectives or masks. For example, yield mask 20 can be assigned a higher priority than performance mask 40. In this example, the operational characteristic setting value in cell 98 controls over the operational characteristic setting value in cell 97. If the setting value in cell 98 indicates that the functional component associated with column 12 is disabled, the functional component is disabled regardless of the setting value in cell 97. The values in mask array 10 can also be utilized in a variety of algorithms that account for a variety of considerations in determining an operational characteristic setting that is implemented by a functional component configuration controller.

Yield mask 20 provides an indication of functional components that are disabled due to yield issues (e.g., defects). For example, yield mask 20 includes operational characteristic setting values that cause functional components to be disabled if the functional components have a manufacturing defect. In one exemplary implementation, a functional component is permitted to be disabled if there is another operational functional component that can handle the work flow.

Compatibility mask 30 provides an indication of operational characteristics for functional components based upon compatibility issues. For example, a particular processor and chip set can exchange identification with one another and based upon the exchange of identification, compatible supported functional component operational characteristics can be enabled. In one embodiment of the present invention, compatibility is established by a driver and a corresponding operational characteristic setting value is entered in compatibility mask 30.

Performance mask 40 provides an indication of operational characteristics for functional components based upon performance issues. For example, a particular application is being run and a value is entered into performance mask 40 enabling corresponding desirable supported functional component operational characteristics. If the application is a graphics application additional graphics pipelines can be enabled and/or the clock speed of existing graphics application pipelines can increase. In one embodiment of the present invention, the type of the system can be factored into performance operational changes, for example in mobile devices a value entered in performance mask 40 can direct a performance adjustment to conserve power. For example, direct changes to operational characteristics of functional components, including disabling/enabling functional components, adjusting speed, voltage, etc.).

Self healing mask 50 provides an indication of operational characteristics for functional components based upon field testing issues. For example, results from testing operations are utilized to determine changes in operational characteristics for functional components. In one exemplary implementation, a field test indicates that an enabled first functional component is defective. The operational characteristic setting value in the self healing mask cell associated with the first functional component is changed to indicate the first functional component is disabled and the operational characteristic setting value in the self healing mask cell associated with a second functional component that is disabled is changed to indicate the second functional component is enabled. By changing the respective operational characteristic setting values of the first and second functional components the defective first component is disabled and prevented from producing more problems and enabling a disabled second functional component allows the second functional component to perform the workflow that would otherwise be routed to the first functional component and thus the system in effect heals itself in that the same work flow is still able to be performed without defects.

Figure 2:
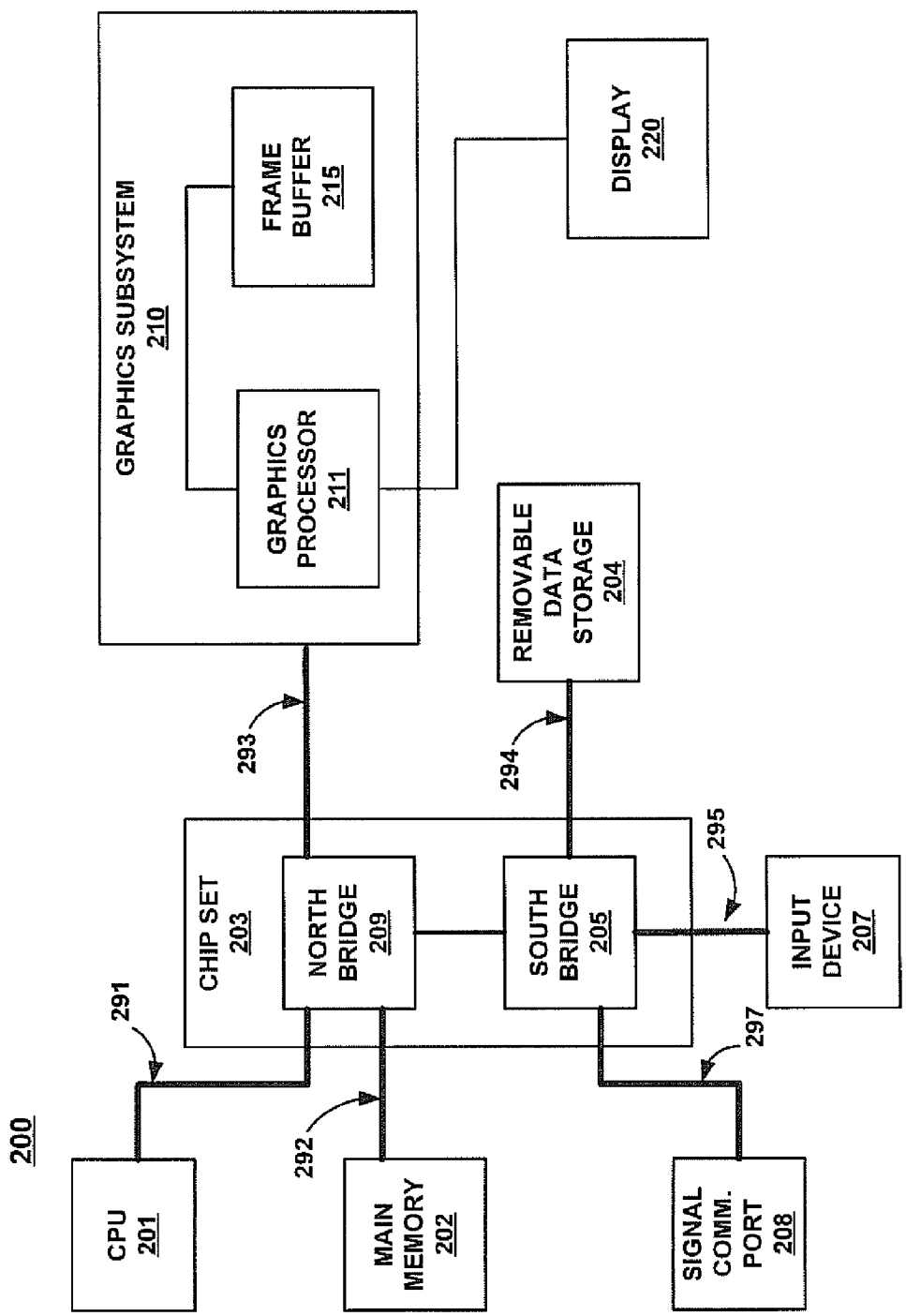
FIG. 2 is a block diagram of a computer system in which embodiments of the present invention can be implemented.

FIG. 2 is a block diagram of a computer system 200, one embodiment of a computer system upon which embodiments of the present invention can be implemented. Computer system 200 includes central processor unit 201, main memory 202 (e.g., random access memory), chip set 203 with north bridge 209 and south bridge 205, removable data storage device 204, input device 207, signal communications port 208, and graphics subsystem 210 which is coupled to display 220. Computer system 200 includes several busses for communicatively coupling the components of computer system 200. Communication bus 291 (e.g., a front side bus) couples north bridge 209 of chipset 203 to central processor unit 201. Communication bus 292 (e.g., a main memory bus) couples north bridge 209 of chipset 203 to main memory 202. Communication bus 292 (e.g., the Advanced Graphics Port interface) couples north bridge of chipset 203 to graphic subsystem 210. Communication buses 294-297 (e.g., a PCI bus) couple south bridge 205 of chip set 203 to removable data storage device 204, input device 207, signal communications port 208 respectively. Graphics subsystem 210 includes graphics processor 211 and graphics buffer 215.

The components of computer system 200 cooperatively operate to provide versatile functionality and performance. The operating characteristics of functional components included in computer system 200 can change dynamically. In one exemplary implementation, the components of computer system 200 cooperatively operate to provide predetermined types of functionality, even though some of the functional components included in computer system 200 may be defective. Communications buses 291, 292, 293, 294, 295 and 297 communicate information. Central processor 201 processes information. Main memory 202 stores information and instructions for the central processor 201. Removable data storage device 204 also stores information and instructions (e.g., functioning as a large information reservoir). Input device 206 provides a mechanism for inputting information and/or for pointing to or highlighting information on display 220. Signal communication port 208 provides a communication interface to exterior devices (e.g., an interface with a network). Display device 220 displays information in accordance with data stored in frame buffer 215. Graphics processor 211 processes graphics commands from central processor 201 and provides the resulting data to graphics buffers 215 for storage and retrieval by display monitor 220.

The operational configurations of the functional components included in computer system 200 are flexibly adaptable to meet a variety of objectives. For example, operational configurations of the functional components included in computer system 200 are configurable to maintain execution of a type of function even if some of the functional components are disabled. In one exemplary implementation, central processor 201 and graphics processor 211 are still capable of executing the same type of processing functions and main memory 202 stores information even through some of the functional components (e.g., floating point component, pixel shader component, memory cell component, etc) are disabled. In one embodiment, the processors include a plurality of functional components for performing processing operations. The operational characteristics of the functional components can be altered. In one embodiment, the processors include a plurality of functional components for performing processing operations, wherein defective functional components included in the plurality of functional components are disabled. The processors also include a workflow control component for dispensing workflow to enabled processing components and preventing distribution of workflow to the disabled defective components. In one exemplary implementation, computer system 200 can continue to provide full functionality even through the functionality may be provided at a reduced performance level (e.g., slower).

It is appreciated that the present invention can be implemented in a variety of embodiments. In one exemplary implementation the present invention can be utilized in processing systems utilized to provide a variety of graphics applications including video games. For example, the present invention can be utilized to disable defective components in a game console, personal computer, personal digital assistant, cell phone or any number of platforms for implementing a video game. It is also appreciated that references to video game application implementations are exemplary and the present invention is not limited to these implementations.

Figure 3:
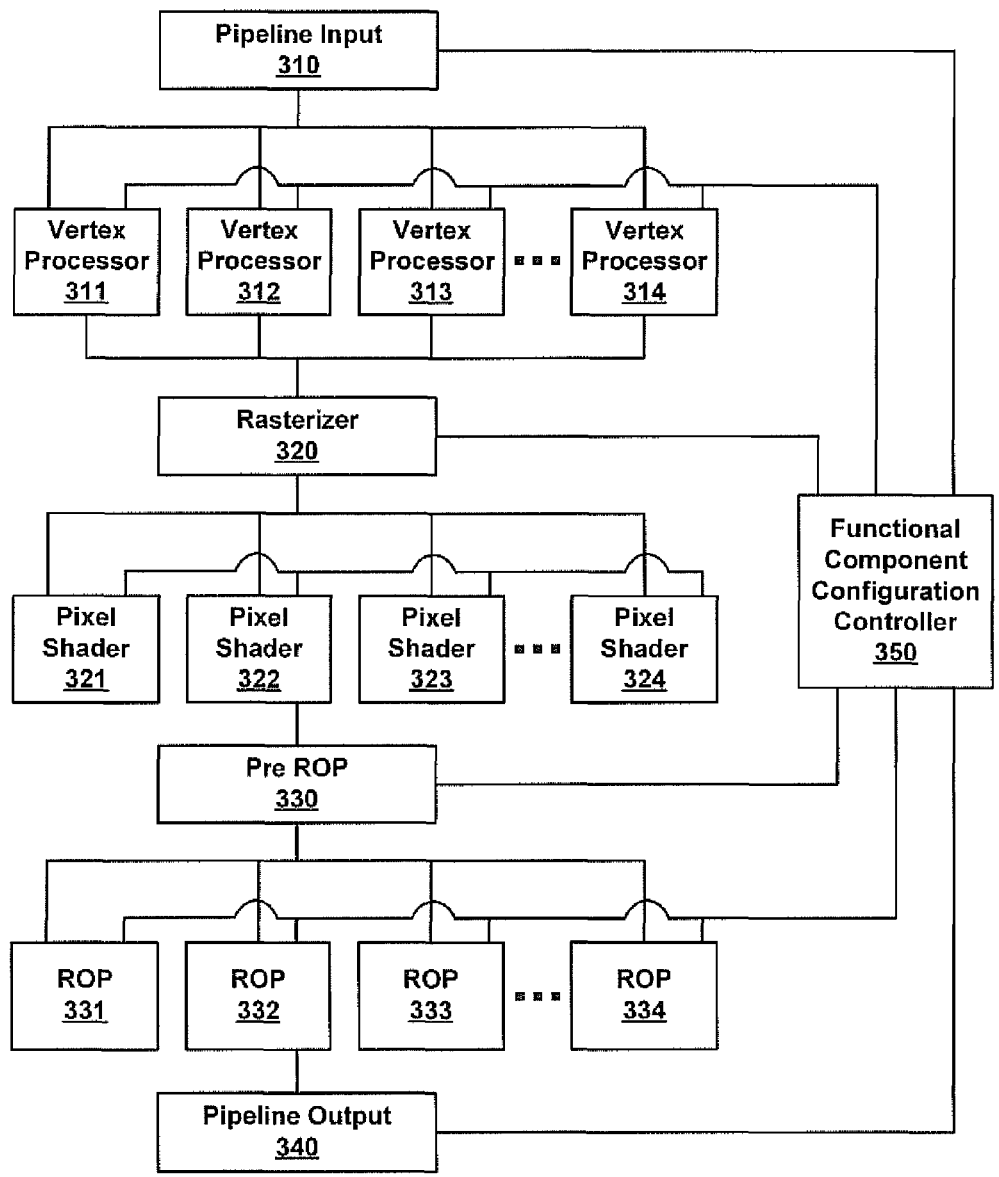
FIG. 3 is a block diagram of a graphics pipeline in accordance with one embodiment of the present invention.

FIG. 3 is a block diagram of graphics pipeline 300 in accordance with One embodiment of the present invention. Graphics pipeline 300 (e.g., a pixel processing pipeline) comprises pipeline input 310, vertex processors 311 through 314, rasterizer 320, pixel shaders 321 through 324, pre-raster operation (ROP)component 330, raster operation components 331 through 334, pipeline output 340 and functional component configuration controller 350. Functional component configuration controller 350 is coupled to pipeline input 310, vertexprocessors 311 through 314, rasterizer 320, pixel shaders 321 through 324, pre-rasteroperation (ROP) component 330, raster operation components 331 through334, and pipeline output 340. Pipeline input 310 is coupled to vertex processors 311 through 314 which are coupled to rasterizer 320. Rasterizer 320 is coupled to pixel shaders 321 through 324 which are coupled to pre-raster operation component 330. Pre-raster operation (ROP) component 330 is coupled to raster operation components 331 through 334 which are coupled to pipeline output 340.In one embodiment, graphics pipeline 300 is similar to pipeline integrated circuit 150. For example, pipeline 171 can include vertex processor 311, pixel shader 321 and ROP 331; pipeline 172 can include vertex processor 312, pixel shader 322 and ROP 332; pipeline 173 can include vertex processor 313, pixel shader 323 and ROP 333; and pipeline 174 can include vertex processor 314, pixel shader 324 and ROP 334 with pipeline input 310, rasterizer 320, pre ROP 330 and pipeline output 340 common to pipelines 171-174.

The components of graphics pipeline 300 cooperatively operate to perform graphics pipeline operations even if some of the operational characteristics of functional components in the pipeline are changed (e.g., disabled/enabled). Functional component configuration controller 350 can change the operational characteristics of vertex processors 311 through 314, pixel shaders 321 through 324, and/or raster operation components 331 through 334. Functional component configuration controller 350 can make a variety of changes to the operational characteristics, including enabling/disabling a functional component, changing the clock speed of the functional component and/or increase the voltage supply to the functional component. The functional component configuration controller 350 can make the changes for a variety of reasons, including yield issues (e.g., the function component is defective and/or associated with a defective component), compatibility issues, performance issues and/or system "health" issues. Functional component configuration controller 350 also provides information on operational characteristic changes to pipeline input 310, rasterizer 320, pre-raster operation (ROP) component 330, and pipeline output 340. Pipeline input component 310 receives graphics pipeline information and distributes corresponding packetized graphics pipeline information to vertex processors 311 through 314 remaining enabled. Vertex processors 311 through 314 perform vector shading on the respectively received graphics pipeline information and forward the resulting information to rasterizer 320. Rasterizer 320 determines which pixels to shade and distributes packetized vector shaded graphics pipeline information to pixel shaders 321 through 324. Pixel shaders 321 through 323 perform pixel shading calculations on the packetized vector shaded graphics pipeline information and forward the results to pre-raster operation (ROP) component 330.

In one embodiment, the pixel shaders 321 through 324 can also perform texture operations. The texture operations can be performed by texture shader components (e.g., corresponding to the pixel shaders). Pre-raster operation (ROP) component 330 gathers the vector shading information and distributes packetized pixel shaded information to raster operation components 331 through 334. Raster operation components 331 through 334 perform additional rasterizing processing on the packetized pixel shaded information (e.g., performing color binding and Z buffer processing) and forwards the results to pipeline output 340. Pipeline output 340 aggregates the graphics pipeline information into a single output stream. Alternatively, the Functional Component Configuration Controller 350 may be implemented as a cross bar or multiplexer structure positioned between the respective levels of the functional components in the pipeline.

The present invention can also be applied to portions of a frame buffer interface that are split into multiple partitions. In one exemplary implementation, the frame buffer interface includes multiple similar modules that operate as functional components that communicate with a memory (e.g., a portion of a DRAM that makes up the frame buffer). If one of the modules are defective it can be disabled and the workload of the defective module is reassigned to another module (e.g., based upon the portion of the memory addresses associated with the module). For example, the mapping of frame buffer interface modules to memory addresses are remapped so that the entire memory is still available to the chip.

Figure 4:
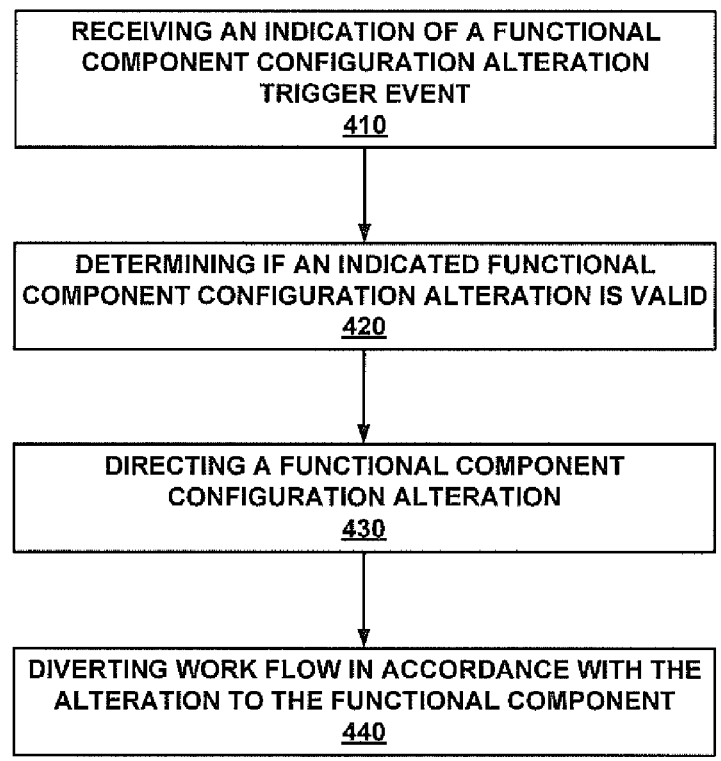
FIG. 4 is a flow chart of a functional component configuration method in accordance with one embodiment of the present invention.

FIG. 4 is a flow chart of functional component configuration process 400, in accordance with one embodiment of the present invention. Functional component configuration process 400 facilitates flexible configuration of functional components in an integrated circuit. For example, functional component configuration process 400 directs changes to the operational characteristics (e.g., enable, disable, change speed, change voltage, etc.) of functional components in an integrated circuit. It is appreciated that functional component configuration process 400 can be utilized to reconfigure operational characteristics of a functional component in accordance with a variety of objectives (e.g., increase yield, provide flexible performance, facilitate self-healing, etc.). In one embodiment, functional component configuration process 400 also facilitates efficient information processing workflow management.

In step 410, an indication of a functional component configuration (e.g., operational characteristic) alteration trigger event is received. In one embodiment of the present invention, the indication of the alteration trigger event is received by a functional component controller (e.g., 120, etc.). The indication can include an indication of the configuration change to be made (e.g., disable, enable, increase/decrease speed and/or voltage, etc.). In one embodiment, the functional component configuration alteration trigger event is received from an internal component of the integrated circuit (e.g., an internal testing system, a driver, an application, etc.). The indication of a functional component configuration alteration trigger event can also be received from a component external to the integrated circuit (e.g., an external testing system, the internet, a centralized configuration system, etc.).

It is appreciated that the indication and configuration alteration trigger event can be associated with a variety of operational objectives (e.g., application, pay per use, market segmentation, etc.). An alteration trigger event can be associated with a yield issue. For example, the event can be associated with testing operations detecting a defective functional component and an indication identifying the defective functional component is received (e.g., by a functional component controller). In one embodiment of the present invention, the indication of a defective functional component is received from a testing system. For example, an International Electrical and Electronic Engineering (IEEE) Standard 1149.1 (also referred to as Joint Task Action Group (JTAG) testing) compliant testing system and/or a proprietary operational integrity test (e.g., a proprietary scan test mechanism). An alteration trigger event can be associated with a compatibility issue. For example, a signal indicating a component has a predetermined compatibility is received. An alteration trigger event can be associated with a performance issue. For example, a signal is received indicating a new and/or different application is being loaded, a pay per use authorization is granted, and/or the integrated circuit is included in a mobile device in which power conservation is desirable. An alteration trigger event can also be associated with a self test and healing issue.

In step 420, a determination is made if an indicated functional component configuration alteration (e.g., operational characteristic alteration) is valid. For example, a determination of an authorized operational characteristic for the functional component is made. In one embodiment, the indication received in step 410 is an encoded bit stream. The bit stream is decoded and the resulting value is examined for valid authorization to trigger a functional component configuration alteration. In one embodiment of the present invention, an encoded indicator is analyzed. The analysis includes decoding the indicator and comparing it to a predetermined list of different possible operational characteristic settings for the functional component. For example, the value of the decoded indicator is compared to values in a predetermined list of authorized trigger indications or values, wherein the values in the list are associated with a particular operational characteristic setting.

It one embodiment of the present invention, the functional component configuration alteration action is also checked for validity. For example, when performing a functional component disablement in association with yield and self healing issues, in one embodiment a determination is made if there is a second functional component (e.g., in parallel) that can perform similar functions on the workflow information that would have otherwise went to a defective functional component. For example, a determination is made if a defective functional component is one of a plurality of similar functional components. In one embodiment of the present invention, the type of defective component is compared to a list of multiple components that provide similar functions. For example, the defective component is identified (e.g., a pixel shader, vertex processor, floating point component, etc.) and the identified functional component is compared against a list of other similar components that can provide the same functionality. In one exemplary implementation, the other similar components are examined to determine if they are parallel components to the defective functional component. If there is a second functional component that can perform the workflow the first functional component can be disabled (e.g., if the first functional component is defective).

In step 430, a functional component configuration alteration is directed. In one embodiment of the present invention, the functional component configuration alteration (e.g., operational characteristic alteration) is directed by a functional component controller (e.g., 120, 152, 192, etc.). In one embodiment of the present invention, the functional component configuration change (e.g., disabling, enabling, etc.) is accomplished by programming a value (e.g., in a register) that controls the configuration (e.g., operational characteristics) of the functional component. Based upon the value in the register a signal is sent to the functional component which changes the configuration (e.g., disables, enables, etc.) the component. In one exemplary implementation, the values are configured in a mask (e.g., mask10). It is appreciated that there are a variety of present invention methods for altering the configuration (e.g., altering operational characteristics) of a functional component. For example, the disabling of a defective functional component can accomplished by fusing communication lines to the defective functional component. The defective functional component can also be disabled in manner that ensures the defective functional component does not generate spurious traffic. A receiving component can also be notified of a defective component and programmed to ignore information coming from the defective functional component. Functional component configurations can also be altered by soft coded methods.

In one embodiment, on going operations of the functional components are monitored and factored into the configuration operations of step 430. For example, the system "health" is checked or tested and the results are utilized in determining changes to operational characteristics. For example, if a first functional component fails a self diagnostic test the functional component can be disabled. If a second functional component is available it can be activated to "replace" the first functional component. For example, if the second functional component works perfectly fine but was previously disabled for some other reason, it can be enabled to replace the functional component that failed the test. In one exemplary implementation, application activation is monitored and operational characteristics of functional components altered accordingly. For example, if a high performance graphics application is activated, the operational characteristics of functional components can be increased (e.g., faster clock setting) and/or additional functional components (e.g., additional graphics pipelines) can be enabled or disabled.

Changes of components in a system (e.g., adding new components) can also be monitored and operational characteristics changed to accommodate the component changes. For example, if a particular type of graphics processor is coupled to a particular type of chip set, an identification indication can be communicated and the operational characteristics of functional components can be altered accordingly. The identification permits predetermination of compatibility and support for enhanced features. In one embodiment, the identification is encoded. The encoding prevents malicious tampering with operational characteristic settings. For example, encoding provides protection from attempts at inappropriately reducing operational characteristics of functional components and/or increasing operational characteristics without compatibility assurance which could otherwise potentially introduce complex faults that are difficult to identify.

In one embodiment of the present invention, the operational characteristic changes are coordinated amongst functional components. For example, a properly operating functional component that is closely associated with a changed functional component (e.g., in the same pipeline, thread, etc) can also be changed. In one exemplary implementation, operational changes are coordinated amongst functional components to maintain product differentiation. For example, if a lower performance chip is specified as having one less pixel shading component and one less vertex shading component, both a pixel shading component and a vertex shading component can be disabled to maintain product differentiation.

In step 440, workflow is diverted in accordance with the alteration to a functional component. For example, the work flow can be diverted to other similar functional components. In one embodiment, diverting the workflow is accomplished by providing notification of the configuration alteration (e.g., enablement, disablement, etc.) to a component that otherwise communicates information to the altered functional component. For example, a functional component controller (e.g., 120, etc.) provides an indication of a functional component configuration alteration (e.g., change in operational characteristic) to a distribution component (e.g., 110, etc.) and the distribution component routes work flow information accordingly. For example, if a first functional component is enabled workflow is routed or scheduled and forwarded to the first functional component. If a first functional component is disabled the workflow is routed or scheduled to another enabled functional component.

In one exemplary implementation, the workflow is diverted or routed to faster or slower functional components. For example, workflow contents are analyzed and parts of the workflow associated with higher performance activities are routed to a faster functional component (e.g., a functional component operating at a higher clock rate) and parts of the workflow associated with lower performance activities are routed to a slower functional component. Pixels in an area of graphics image that are changing rapidly (e.g., pixels towards the center of the display) can be routed to a faster functional component (e.g., high clocked shader) and pixels in an area of graphics image that are changing slowly (e.g., pixels towards the edge of the display) are routed to a slower functional component (e.g., low clocked shader).

The functional component operational characteristic changes (e.g., disabling, etc.) can be coordinated in a manner that reduces impacts to other components. In one embodiment, properly operating functional components can be programmed or reconfigured to be tolerant of possible garbage (e.g., illegal signal combinations) on the outputs of the disabled components. For example, a properly operating functional component can be directed to ignore information from a disabled component. A receiving component (e.g., collection component 140) can also be notified of an operational characteristic change in a functional component and programmed to react accordingly. For example, if the speed of the functional component is lowered the receiving component can be programmed not to idle while waiting for information coming from the functional component but to check back later or if the functional component is disabled to ignore information from the functional component. If the functional component is disabled the receiving component can be programmed to ignore signals from the functional component.

Figure 5:
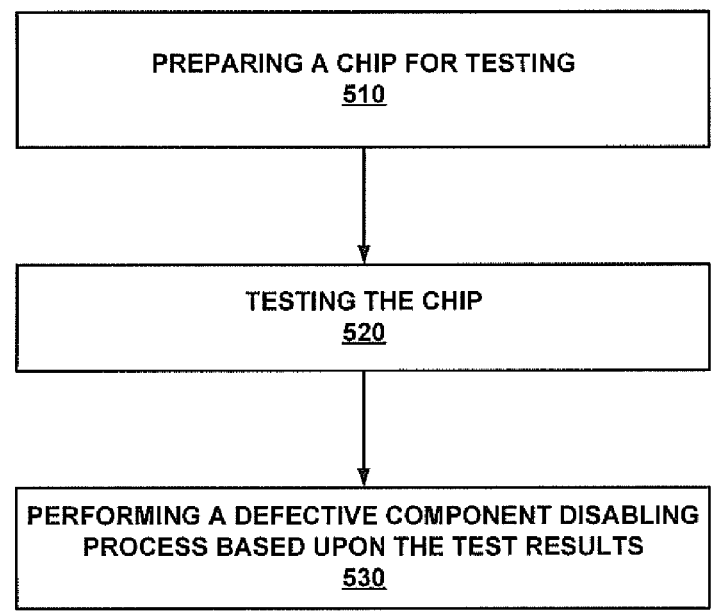
FIG. 5 is a flow chart of a reduced performance circuit salvage method in accordance with one embodiment of the present invention.

FIG. 5 is a flow chart of reduced performance circuit salvage method 500, in accordance with one embodiment of the present invention. Reduced performance circuit salvage method 500 facilitates redemption of die that would otherwise be discarded. In one embodiment reduced performance circuit salvage method 500 tests die and disables defective functional components in a manner that ensures the functionality of the die is maintained.

In step 510, a chip is prepared for testing. A chip is placed in a testing system and the testing system is initialized. In one embodiment of the present invention, initial states for a scan test are entered in scan test cells. For example, the chip can be prepared for testing in accordance with International Electrical and Electronic Engineering (IEEE) Standard 1149.1 (also referred to as Joint Task Action Group (JTAG) testing). In one embodiment of the present invention, a custom type of testing that is compatible with testing capabilities of the chip (e.g., a proprietary and/or non-JTAG-compliant testing) is utilized.

In step 520 the chip is tested. In one embodiment of the present invention the testing comprises identifying defective functional components of the chip. In one exemplary implementation of the present invention, a built in self test (BIST) is performed. For example, a scan test is included in the BIST in which test vectors are applied to stimulate certain aspects of a circuit (e.g., a functional logic component) and the resulting output from the circuit is captured. The scan test chain is designed to scan or shift scan test information (e.g., test vectors) to functional components in a circuit via a scan test chain, cause a functional component to perform an operation on the scan test information, capture the resulting information and then shift the resulting information out via scan test cells of the scan test chain. The resulting information is then analyzed for errors (e.g., compared to predetermined correct results). The test vector patterns can be provided by an automated test pattern generation (ATPG) tool.

In one embodiment of the present invention, particular functional components that are defective are identified. In one exemplary implementation, the output results of a scan test provide an indication of which functional components are defective. For example, the test pattern results are analyzed and the defective functional components identified. The present invention can determine if a defective functional component is one which does not have another functional component included in the die that is similar. In one embodiment, a distinction is made if the defective functional component is critical and/or the die does not have another functional component that can handle the work flow if the defective functional component is disabled. If such a functional component is identified, the die is discarded in one embodiment of the present invention since the die could not provide full functionality.

In one embodiment of the present invention, disabling components are utilized to facilitate identification of a defective component. In one exemplary implementation, test vector operations are performed by a plurality of similar functional components (e.g., pixel shaders 321 through 324). If there is an erroneous result further testing is performed. A first one of a plurality of functional components (e.g., pixel shader 321) is disabled by a disabling component and test vector operations are performed by the remaining functional components. Alternatively, in the testing process software simulation can be utilized to simulate the disablement of a functional component. For example, pixel shader 321 is disabled and test vector operations are performed by pixel shader 322 through 324 and the results analyzed. If there are no erroneous results the first functional component is identified as a defective component. If there are continued erroneous results a second one of a plurality of functional components (e.g., pixel shader 321) is disabled by a disabling component and test vector operations are performed by the remaining functional components. If there are no erroneous results the second functional component is identified as a defective component. The process of elimination continues until the defective component is identified.

In step 530, a functional component configuration process (e.g., functional component configuration process 400) is performed on the chip based upon results of the testing. In one embodiment of the present invention, the functional component configuration process disables one or more of a plurality of homogenous functional components (e.g., execution components) of the chip if the functional components are defective. For example, a disable signal is issued to the defective functional component.

In one embodiment, reduced performance circuit salvage method 500 includes programmably reconfiguring the chip to permit other functional components to perform the functions of the disabled functional component. For example, a mask is programmed into a distributing component that identifies disabled functional components and the work flow can be distributed between the remaining functional components. It can be programmed as either a software loadable register or a hardcoded mask type program that is performed at test time. There are a variety of techniques that can be utilized including programmable non-volatile memory, fuses, wire bond straps, etc.

In one embodiment of reduced performance circuit salvage method 500, a program in the tester includes definitions of characteristics of a die for a particular performance level. In one exemplary implementation, the tester includes an indication of what defects are permissible in each performance level. For example, the tester can include a first performance level in which a first plurality of parallel functional components can be disabled and a second performance level in which a second plurality of parallel functional components can be disabled. The performance level can also correspond to the number of functional components that are enabled. The present invention can also facilitate automatic binning of the die based upon performance levels as part of the testing procedure.

Figure 6:
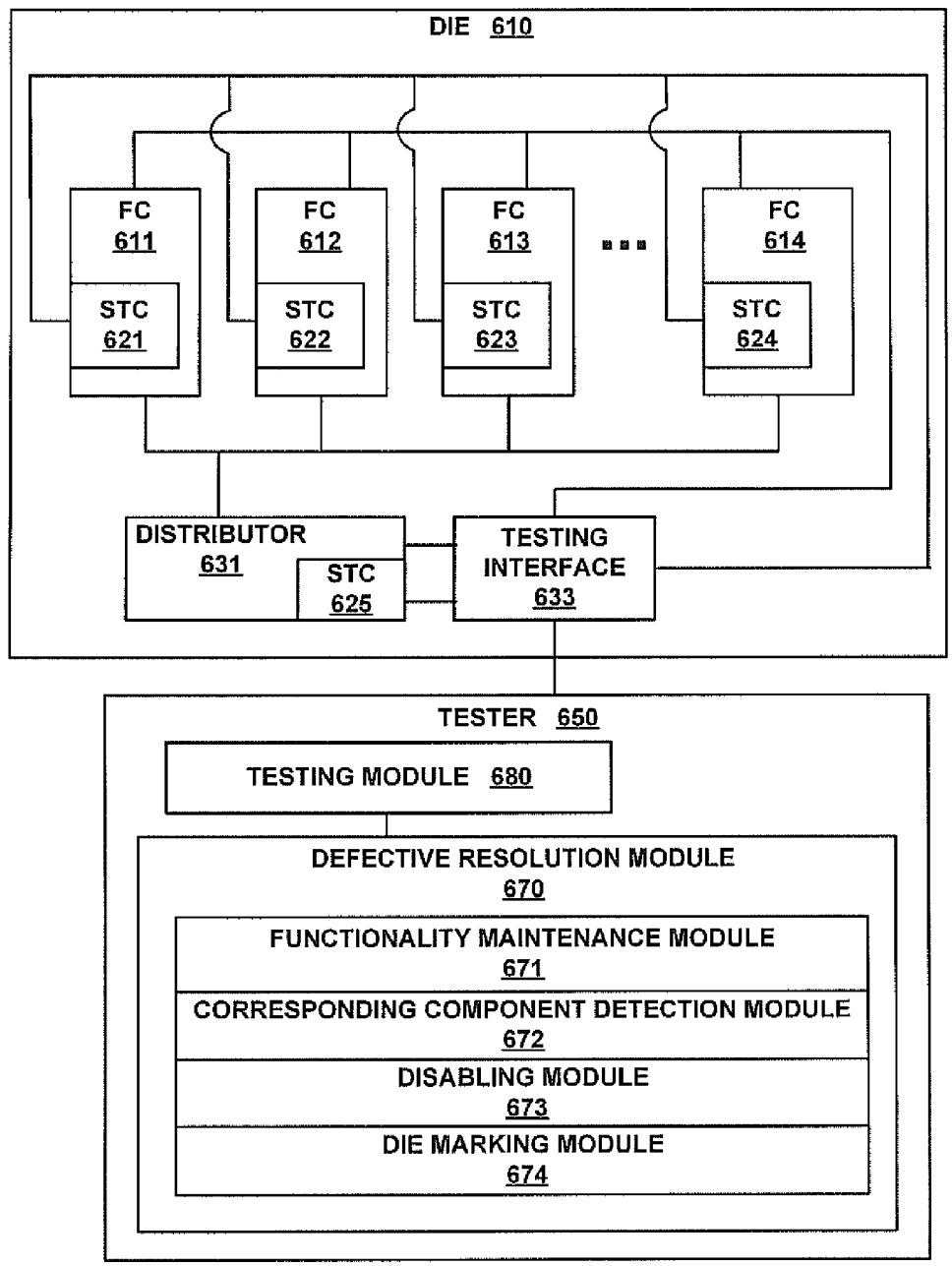
FIG. 6 is a block diagram of a testing environment in accordance with one embodiment of the present invention.

FIG. 6 is a block diagram of testing environment 600, a testing environment in accordance with one embodiment of the present invention. Testing environment 600 includes die 610 and testing system 650. Die 610 comprises, testing interface 633, distributor 631 and functional components 611 through 614, with each functional component and distributor 631 including scan test cells 621 through 625 respectively. Die salvage testing system 650 comprises testing module 680 and defective component resolution module 670, which includes functionality maintenance module 671, corresponding component detection module 672, disabling module 673 and die rejection module 674.

Die salvage testing system 650 tests die 610. Testing module 680 provides test vectors to testing interface 633 which passes the test vectors on to scan test cells 621 through 625. The information in scan test cells 621 through 625 are fed into functional components 611 through 614 and distributor 631, which perform an operation on the scan test information. The results are also captured by scan test cells 621 through 625 and communicated to testing interface 633 which passes them to testing system 650 for analysis. Testing module 680 analyzes the results and provides an indication of defective functional components to defective resolution module 670. Defective resolution module 670 determines if a die can be salvaged by disabling functional components.

Functionality maintenance module 671 determines if the identified functional component is included in a group that is permitted to be disabled. In one embodiment, functionality maintenance module 671 determines if there are other functional components that can handle the workflow of the identified (e.g., defective) functional component. For example, the workflow can be transferred or rerouted to another functional component. In one exemplary implementation, functionality maintenance module 671 checks the identified functional component against a predetermined list of components that are allowed to be disabled (e.g., other components can handle the workflow).

Corresponding component detection module 672 determines if there are related functional components that should be disabled. The related functional components can be properly functioning components. In one embodiment of the present invention, a functional component that is closely associated with a defective functional component (e.g., in the same pipeline, thread, etc.) is identified. For example, if the functional component is downstream from a defective component, the properly functioning component can be disabled (e.g., powered down) to prevent switching activities and corresponding power consumption. In one exemplary implementation, functional components can be disabled to maintain product differentiation. If other functional components that should be disabled are identified, the identity of these components is fed back into functionality maintenance module 671 to determine if disabling them would impact functionality.

Disabling module 673 directs functional component disablement (e.g., disablement of functional components 611, 612, 613 or 614). In one embodiment of the present invention, disabling module 673 sends a disablement signal directly to a functional component via the test interface 633. In an alternate embodiment, disabling module 673 sends a signal to a disabling component (not shown) in die 610. Disabling module 673 disables a functional component if functionality maintenance module 671 provides an indication that it is permissible to disable the component (e.g., it will not eliminate functionality). In one exemplary implementation, functionality maintenance module 671 allows disabling module 673 to disable a functional component even if it reduces performance, as long as it does not reduce functionality.

Die marking module 674 marks a die. In one embodiment of the present invention, die marking module 674 marks a die based upon a performance criteria. Die marking module 674 also provides a marking or indication if a die is rejected. The die can be rejected because functionality maintenance module 671 provides an indication that a defective functional component should not be disabled and/or the performance of the die drops below a predetermined level. In one exemplary implementation, a die is marked based upon the functional components that are disabled. For example, if a predetermined number and/or type of functional component is disabled the die is marked accordingly.

In one embodiment of the present invention, die marking module 674 also marks a wafer upon which the die is located. In one embodiment of the present invention, die marking module 674 marks a wafer based upon a yield criteria. The yield criteria can be segmented for difference performance levels. For example, the yield marking can indicate that a certain number or percentage of the die in a wafer have no disabled functional components, a certain number or percentage of die have a set number of disabled functional components, and a certain number or die are rejected or unsalvageable.

Figure 7:
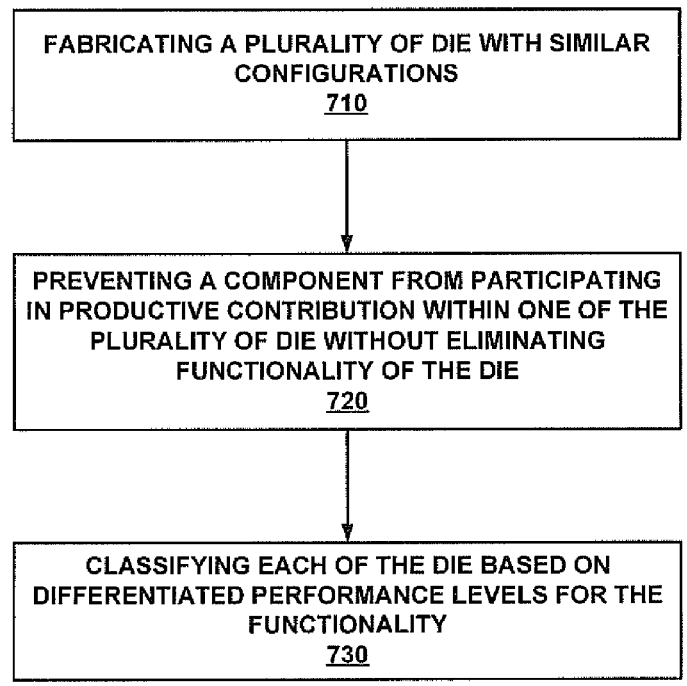
FIG. 7 is a flow chart of a die classification process in accordance with one embodiment of the present invention.

FIG. 7 is a flow chart of die classification process 700, one embodiment of a die classification process in accordance with one embodiment of the present invention. Die classification process 700 involves the manufacturing and classification of die with similar configurations at differentiated performance levels. In one exemplary implementation, die that are manufactured in the same fabrication process are classified based upon different performance levels. For example, die have the same number of functional components (e.g., transistors) but some are disabled in a manner that does not prevent execution of a function but may impact performance. Die classification process 700 facilitates the classification and distribution of dies with the same functionality and different performance levels.

In step 710, a plurality of die with similar configurations are fabricated. In one embodiment of the present invention, the plurality of die are fabricated on a single wafer. In one embodiment of the present invention, the similar configurations enable each of the plurality of die to perform a predetermined type of functionality. In one exemplary implementation, the same lithographic process steps are utilized to fabricate the plurality of die. In one embodiment, similar configuration can be determined by reviewing data sheet information on the die. For example, the data sheet information can include the die size (e.g., number of transistors), functionality indicators, and/or performance indicators, and/or information on product lines the die is associated with (e.g., by determining what the die is sold for). Similar configuration can also be indicated if the dies have substantially the same fabrication costs.

In step 720, a component is prevented from participating in productive contribution within one of the plurality of die without eliminating the ability of the die to perform a function associated with the component. In one embodiment of the present invention, the removal of component productivity may impact performance but does not eliminate the type of functionality. In one exemplary implementation, the component is prevented from participating in productive contribution by disabling the component. The work flow of the disabled component can be redirected to other components. In one embodiment, preventing a component from participating in productive contribution can be detected by analyzing data sheet information. For example, if a die has a product sheet applicable to a product line that provides the same types of functionality at different performance levels. Alternatively, another indication of whether a component is prevented from participating in productive contribution is if a determination of which data sheet information applies to a die is not made until after testing is performed (e.g., selection of a data sheet information corresponds to alterations in the die components based upon the results of testing).

Each of the plurality of die are classified in step 730 based on differentiated performance levels for the functionality. In one exemplary implementation, the die are included in products that are distributed or sold at different prices in correlation to the performance level at which the functionality is provided. Dies with the same design are distributed with different performance levels (e.g., different speeds, bandwidth, etc.) in one embodiment of the present invention.

Figure 8:
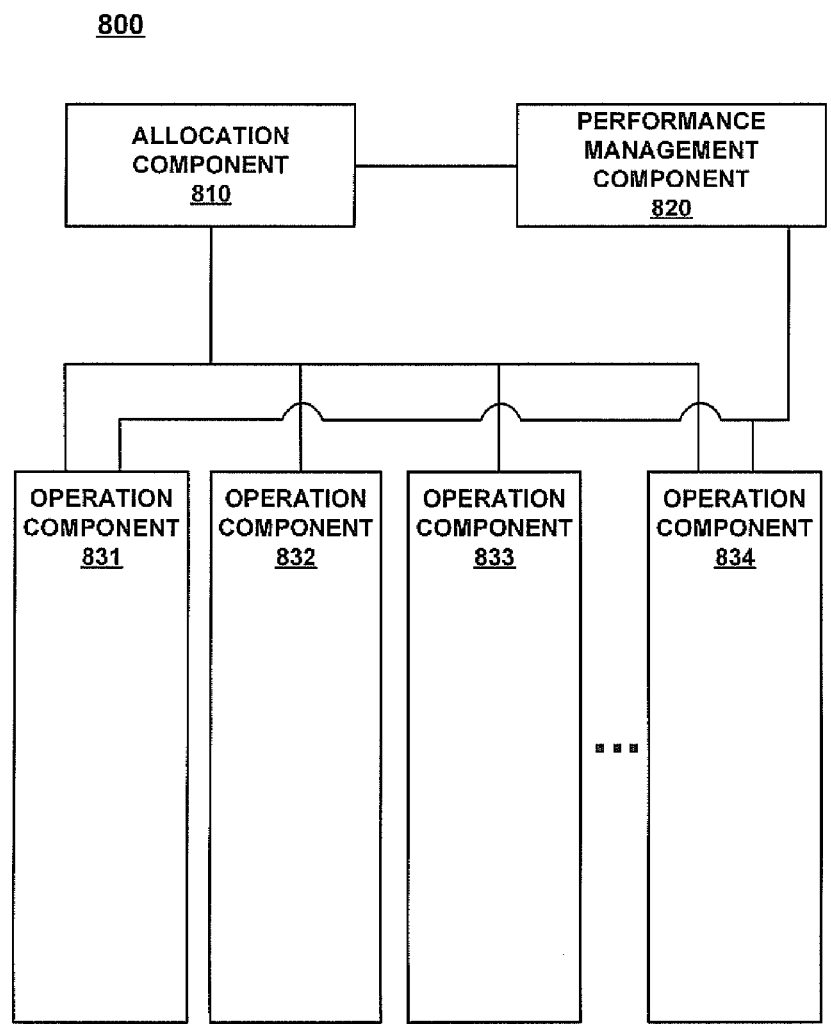
FIG. 8 is a block diagram of a processing unit in accordance with one embodiment of the present invention.

FIG. 8 is a block diagram of processing unit 800 in accordance with one embodiment of the present invention. In one embodiment of the present invention, processing unit 800 is included in a computer based system (e.g., computer system 200). In one exemplary implementation, processing unit 800 is similar to central processing unit 201 and/or graphics processing unit 211. Processing unit 800 comprises allocation component 810, performance management state component 820 and operation components 831 through 834. In one embodiment, allocation component 810 is similar to distribution component 110, performance management state component 820 is similar to functional component controller 120, and operation components 831-834 are similar to functional components 131-134. Each of the operation components 831 through 834 perform processing operations associated with various tasks (e.g., floating point calculations, graphics data manipulation, etc.). In one embodiment, the operation components 831-834 perform similar tasks or functions. Performance management component 820 selectively manages changes in the operational characteristics (e.g., enables, disables, etc.) of each one of the operation components 831 through 834. Allocation component 810 is coupled to operation components 831 through 834 and performance management component 820. Allocation component 810 allocates information to each one of the functional components 831 through 834 that are enabled. For example, allocation component 810 allocates (e.g., distributes) processing work flow information to operation component 831 through 834 if the operation component is enabled. In one embodiment, performance management state component 820 and operation components 831 through 834 are similar to functional component controller 120 and functional components 831-834.

Performance management component 820 receives information indicating a change to operation components. For example, a test result indicates that an operation component is defective. Performance management component 820 identifies a subset of operation components 831 through 834 that the information applies to. For example, a subset of operation components that are defective and that subset is not enabled for use. In one exemplary implementation, a subset that is not defective is enabled. For example, if testing results indicate that operation component 831 and 834 are defective then operation component 820 enables operation component 832 and 833 but does not enable operation component 831 and 834. If operation component 831 and 834 are enabled performance management component 820 disables them. Performance management component 820 also provides an operational characteristic status indication to allocation component 810. For example, the operational characteristic status indication indicates which of the functional components is enabled and which is disabled. Each of the operation components that are enabled are capable of executing similar functions that would otherwise be executed by the operation components that are not enabled.

Figure 9:
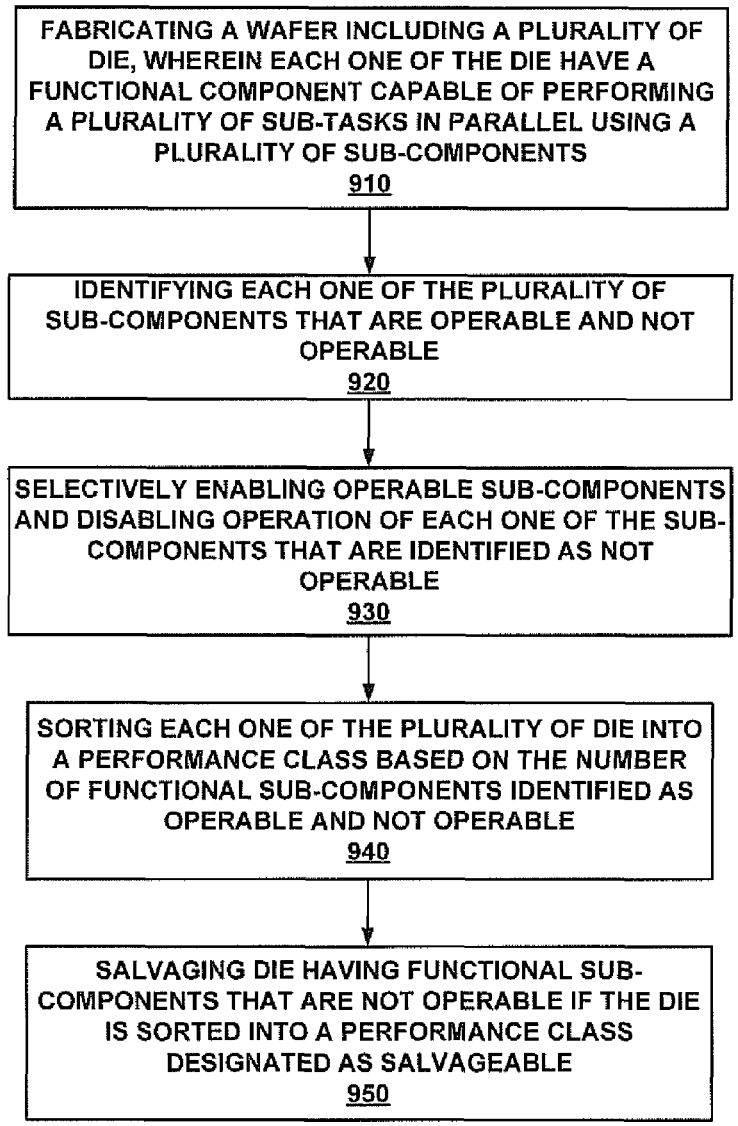
FIG. 9 is a flow chart of a wafer yield optimization method in accordance with one embodiment of the present invention.

FIG. 9 is a flow chart of wafer yield optimization method 900 in accordance with one embodiment of the present invention. Wafer yield optimization method 900 increases the yield of useable die from a wafer. In one exemplary implementation, wafer yield optimization method 900 facilitates salvaging of die with defective components that would otherwise be discarded from a wafer to increase the overall yield from a wafer.

In step 910, a wafer is fabricated. The wafer includes a plurality of die and each one of the plurality of die have a functional component capable of performing a plurality of sub-tasks in parallel using a plurality of functional sub-components. For example, each die can include a pipeline that performs a variety of graphics sub-tasks (e.g., shading, texturing, aliasing, rasterizing, etc.) by functional sub-components (e.g., a shader, a rasterizer, etc). In one embodiment of the present invention the wafer is fabricated using lithographic processes.

In step 920, for each die each one of the plurality of functional sub-components that are operable and each one of the plurality of functional sub-components that are not operable are identified. In one embodiment, the operable and non operable functional sub-components are identified as part of a conventional circuit testing process. For example, predetermined input are fed into a functional sub-component and the resulting output is examined. The output information is examined for errors (e.g., the output is compared to predetermined correct results). If the output information includes an error (e.g., if the output does not match predetermined correct results) the functional sub-component is identified as not operable.

In step 930, operation of each one of said plurality of functional sub-components that are identified as not operable is disabled. In one embodiment, each one of said plurality of functional sub-components that are identified as operable can be enabled. In one embodiment, the non operable functional sub-components are disabled and operable functional sub-components are enabled by a hard "coded" mechanism. For example, foundry laser trim bits are utilized to configure or disable functional sub-components. In another embodiment, software programmable information is utilized to configure (e.g., disable or enable) functional sub-components.

In step 940, each one of the plurality of die are sorted into a performance class based on the operable status (e.g., components identified as operable or not operable in step 930). For example, the die can be sorted into a high performance class in which all or a significant percentage of the functional sub components are operable and enabled. The die can be sorted into a medium performance range class in which less of the functional sub-components remain enabled. These performance ranges can be designated as salvageable. There can also be a performance class in which the die do not meet a minimum and are discarded (or subjected to some other corrective action to possibly fix the problem).

In step 950, the die sorted in a performance class designed as salvageable are salvaged. For example, a die with some disabled functional sub components is used to perform processing tasks, even though the speed at which the tasks are performed is reduced.

Figure 10:
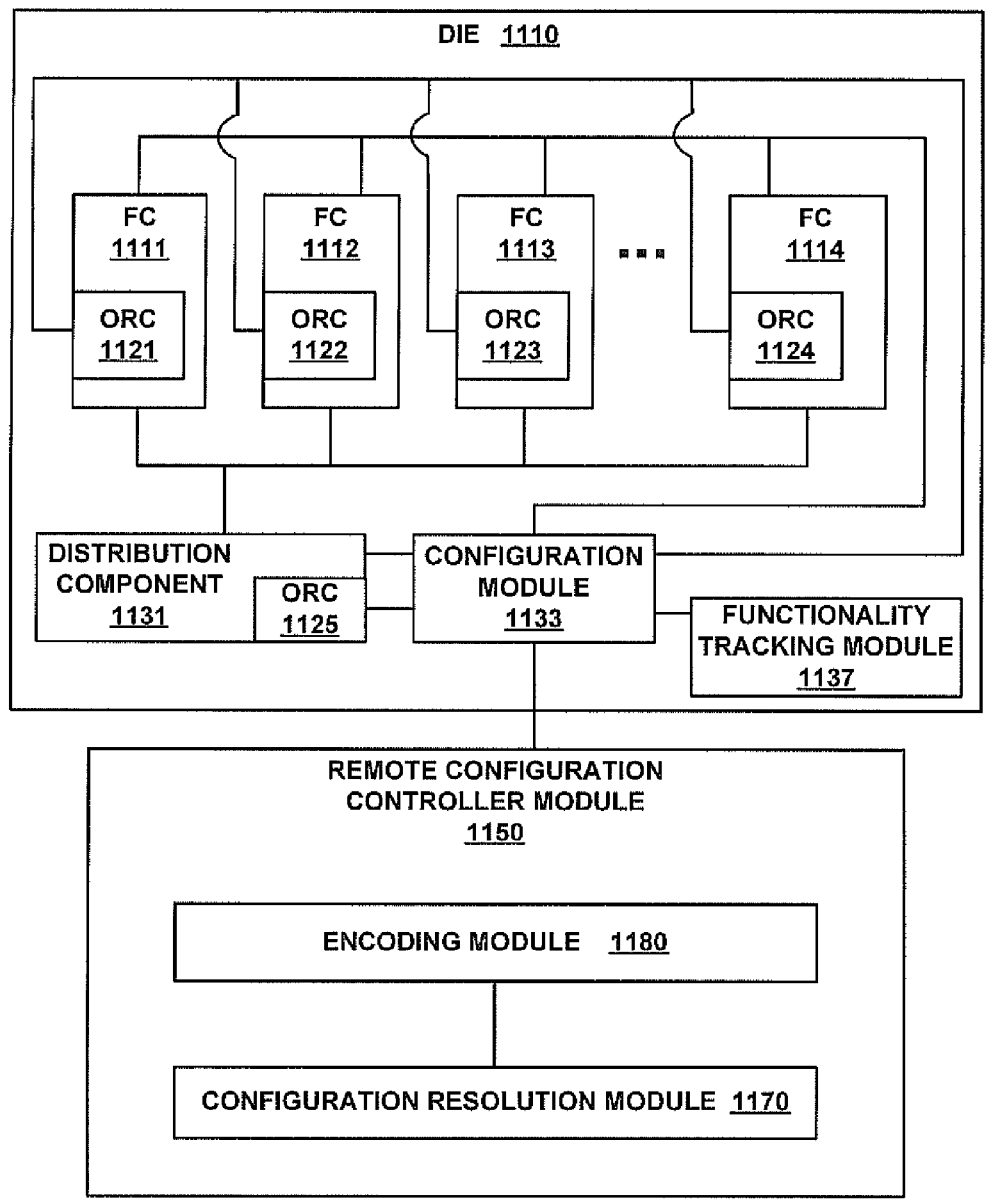
FIG. 10 is a block diagram of a functional component configuration architecture in accordance with one embodiment of the present invention.

FIG. 10 is a block diagram of functional component remote configuration architecture 1100, in accordance with one embodiment of the present invention. Functional component remote configuration architecture 1100 facilitates configuration of functional components included in an integrated circuit die. For example, the configuration is controlled from an external or remote system. Functional component remote configuration architecture 1100 provides an architecture in which operational characteristics of a functional component can be altered in a secure and controlled manner to achieve a number of desirable implementations.

Remote configuration environment 1100 includes integrated circuit die 1110 and remote configuration control module 1150. Integrated circuit die 1110 comprises, configuration module 1133, distribution component 1131 and functional components 1111 through 1114, with each functional component and distribution component 1131 including operational characteristic registers 1121 through 1125 respectively. Remote configuration controller module 1150 comprises encoding module 1180 and configuration resolution module 1170.

Remote configuration controller module 1150 controls configuration of functional components in integrated circuit die 1110. In one embodiment, remote configuration controller module 1150 is off chip (e.g., in a driver). Configuration resolution module 1170 determines the operational characteristic settings for functional components of integrated circuit die 1110. In one exemplary implementation, configuration resolution module 1170 participates in an automated functionality negotiation process (e.g., capacity on demand) in which agreement is reached on upgraded operational characteristics and a functionality indicator is dynamically changed as part of the functionality negotiation process. The operational characteristics are set to maintain product differentiation in one exemplary implementation. Configuration resolution module 1170 forwards an operational characteristic indicator value to encoding module 1180. Encoding module 1180 encodes the operational characteristic indicator value (e.g., with a key, hash value, etc.) and forwards the encoded operational characteristic indicator value to configuration module 1133.

Configuration module 1133 directs functional component configuration. For example, configuration module 1133 directs changes to functional component operational characteristic settings (e.g., for functional components 1111, 1112, 1113 or 1114) based upon the encoded operational characteristic setting value received from encoding module 1180. Configuration module 1133 can decode the functional component operation characteristic indicator value. Configuration module 1133 forwards the decoded value to functionality tracking module 1137 for comparison to a corresponding operational characteristic setting.

Functionality tracking module 1137 directs maintenance of functional component operational characteristics. In one exemplary implementation, functionality tracking module 1137 provides a correlation between a decoded functionality indicator value and a particular operational characteristic setting. For example, functionality tracking module 1137 checks a functionality indicator against a predetermined correlation list of operational characteristic settings. Functionality tracking module 1137 can also determine if there are other functional components that can handle workflow of an identified functional component.

Figure 11:
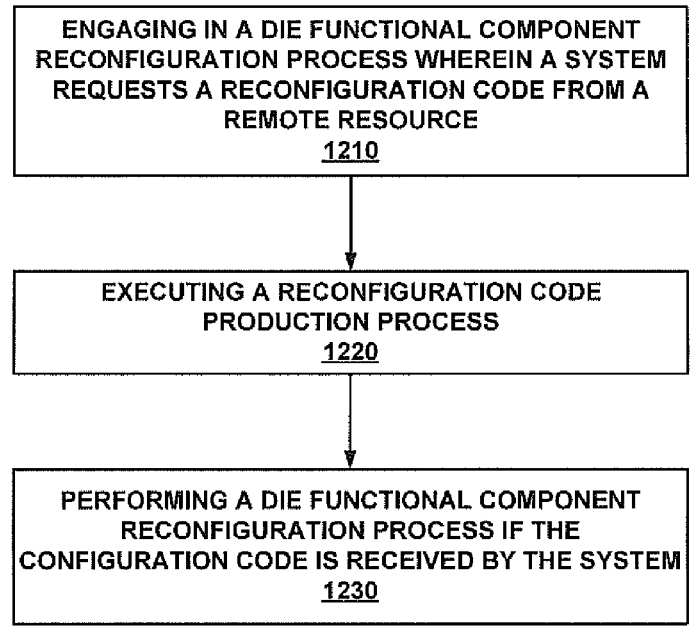
FIG. 11 is a flow chart of a remote reconfiguration method in accordance with one embodiment of the present invention.

FIG. 11 is a flow chart of remote reconfiguration method 1200 in accordance with one embodiment of the present invention. Remote reconfiguration method 1200 provides a mechanism for maintaining remote control of reconfiguration operations. In one exemplary implementation, remote reconfiguration method 1200 is utilized in a pay per use process wherein utilization of certain configuration features require additional payments. For example, if a user desires additional functional components to be activated (e.g., additional graphics pipelines, floating point components, etc.) the user has to make additional payments.

In step 1210, a die functional component reconfiguration request process is engaged in wherein a system requests a reconfiguration code from a remote resource. In one embodiment, a reconfiguration request process includes requesting and receiving a die functional component reconfiguration code. In one exemplary implementation, the die reconfiguration code is utilized by a functional component controller (e.g., 120, etc.) to reconfigure functional components. It is appreciated the request and receipt of a die functional component reconfiguration code can be communicated via a variety of communication systems. For example, the request and the die functional component reconfiguration code can be communicated via the Internet. In one embodiment, the request includes a reconfiguration code permission indicator that indicates the requester is authorized to receive a reconfiguration code (e.g., the requester has made a requisite payment, has an authorized system, etc.).

In one embodiment, the die functional component reconfiguration request process includes a reconfiguration code permission indicator request process to obtain a reconfiguration code permission indicator. In one exemplary implementation, the reconfiguration code permission indicator request process comprises forwarding a payment and request for a permission indicator and receiving a response to the request and payment for the permission indicator. For example, a customer or user makes an electronic payment via the internet to a remote central resource and receives a permission indicator (e.g., bit stream code) in return.

In step 1220, a reconfiguration code production process is executed. In one exemplary implementation, a remote resource processes the request for the reconfiguration code. In one embodiment, the reconfiguration code production process comprises receiving a request for a reconfiguration code and a permission indicator, analyzing validity of the permission indicator, and providing a reconfiguration code if the permission indicator is valid. For example, a remote resource receives a request to increase the number of graphics pipelines activated in a system. The remote resource analyzes if the requester has made a requisite payment. If the requisite payment has been made the remote resource forwards the reconfiguration code for increasing the number of graphics pipelines activated in a system.

In one embodiment, a reconfiguration code production process includes engaging in a reconfiguration code permission indicator response process to respond to a request process to obtain a reconfiguration code permission indicator. In one exemplary implementation the reconfiguration code permission indicator response process includes receiving payment for a permission indicator and forwarding the permission indicator in response to receiving the payment.

In step 1230, a die functional component reconfiguration process is performed if the reconfiguration code is received by a system (e.g., received from a remote resource). The die functional component reconfiguration process includes reconfiguring a die functional component (e.g., functional component 131, 132, 133, 134, etc.) in accordance with the reconfiguration code. In one embodiment the die functional component reconfiguration process is similar to functional component configuration process 400.

Thus, the present invention enables flexible operational configuration of integrated circuit dies and enhances product differentiation. The dies can be utilized in a product line with multiple performance levels. The present invention also facilitates the manufacture of single die capable of being dynamically configured for high performance tasks or low performance tasks permitting power savings and economic differentiation. The present invention also facilitates conservation of manufacturing resources and salvaging of dies with defective components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A reduced performance circuit salvage method comprising:
   preparing a chip for testing;
   testing said chip; and
   performing a functional component configuration process on said chip and based upon results of said testing configuring said chip as a reduced performance circuit, wherein tasks are performed at a different performance level in said chip configured as said reduced performance circuit and said chip still be classified as a useful chip, and wherein said functional component configuration process comprises:
   receiving art indication of a defective functional component;
   determining if said defective functional component is one of a plurality of similar functional components;
   disabling said defective functional component if it is one of said plurality of similar functional components;
   enabling one or more non-defective functional components; and
   providing notification of said disabling and said enabling to a second component other than said defective functional component, wherein said second component is configured to communicate information to at least one of said plurality of similar functional components and bypass said defective functional component to which said second component would otherwise communicate information.

2. The reduced performance circuit salvage method of claim 1 wherein said testing comprises:
   identifying a defective functional component;
   determining if there is a non-defective functional component included in said integrated circuit, wherein said non-defective functional component performs a similar function as said defective functional component;
   designating said defective functional component for non use if said non-defective component is included in said integrated circuit; and
   marking said integrated circuit as defective if said non-defective component that perform said similar function in not is included in said integrated circuit.

3. The reduced performance circuit salvage method of claim 1 wherein one of a plurality of homogenous execution components of said chip is disabled or enabled and said disabling said defective functional component results in said chip performing said tasks slower.

4. The reduced performance circuit salvage method of claim 1 further comprising reconfiguring said chip to permit other functional components to perform functions of said disabled functional component at said different performance level, wherein said different performance level corresponds to the number of enabled said non-defective functional components.

5. The reduced performance circuit salvage method of claim 1 wherein said indication of a defective functional component is received from a testing system.

6. A die classification process comprising:
   fabricating a plurality of die with similar configurations;
   preventing a component from participating in productive contribution within one of said plurality of die without eliminating the ability of said one of said plurality of die to perform a function associated with said component and
   classifying said plurality of die in classes based on differentiated performance levels for said functionality, wherein die in said classes are considered useful wherein a first die and a second die included in said plurality of die are included in different products that are sold at different prices in correlation to a performance level at which functionality is provided, and wherein a determination of which manufacturer data sheet information applies to a die included in said plurality of die is not made until after testing is performed.

7. The die classification process of claim 6 wherein said plurality of die are fabricated on a single wafer.

8. The die classification process of claim 6 wherein similar configuration is determined by reviewing manufacturer data sheet information on said plurality of die.

9. The die classification process of claim 6 wherein similar configuration is determined if dies have substantially the same fabrication costs.

10. The die classification process of claim 6 wherein said component is prevented from participating in productive contribution by disabling said component.

11. The die classification process of claim 6 wherein each one of said plurality of dies are fabricated with the same design and are distributed with different performance levels.

12. A die classification process comprising:
fabricating a plurality of die with similar configurations, wherein similar configuration is determined if dies have substantially the same fabrication costs;
preventing a component from participating in productive contribution within one of said plurality of die without eliminating the ability of said one of said plurality of die to perform a function associated with said component; and
classifying said plurality of die based on differentiated performance levels for said functionality, wherein a first die and a second die included in said plurality of die are included in different products that are sold at different prices in correlation to a performance level at witch functionality is provided.

13. The die classification process of claim 12 wherein said component is prevented from participating in productive contribution by disabling said component.

14. The die classification process of claim 12 wherein a determination of which data sheet information applies to a die included in said plurality of die is not made until after testing is performed.

15. The die classification process of claim 12 wherein each one of said plurality of dies are fabricated with the same design and are distributed with different performance levels.

16. The die classification process of claim 12 wherein said one of said plurality of die is reconfigured to permit other functional components to perform functions of said disabled functional component.

* * * * *